United States Patent
Kuroyanagi

(10) Patent No.: US 8,037,358 B2
(45) Date of Patent: Oct. 11, 2011

(54) SEMICONDUCTOR DEVICE AND BOOT METHOD FOR THE SAME

(75) Inventor: Hiroyuki Kuroyanagi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 370 days.

(21) Appl. No.: 11/798,092

(22) Filed: May 10, 2007

(65) Prior Publication Data

US 2008/0008001 A1 Jan. 10, 2008

(30) Foreign Application Priority Data

May 10, 2006 (JP) .................................. 2006-131505

(51) Int. Cl.
*G06F 11/00* (2006.01)
(52) U.S. Cl. .................. 714/36; 713/1; 713/2; 714/6.24
(58) Field of Classification Search .................... 714/36, 714/37; 713/1, 2
See application file for complete search history.

(56) References Cited

U.S. PATENT DOCUMENTS

| | | | | |
|---|---|---|---|---|
| 5,960,445 | A * | 9/1999 | Tamori et al. ................. | 707/203 |
| 6,388,919 | B2 * | 5/2002 | Terasaki ................... | 365/185.09 |
| 7,334,121 | B2 * | 2/2008 | Lee .................................... | 713/2 |
| 2005/0160217 | A1 * | 7/2005 | Gonzalez et al. .................. | 711/6 |
| 2007/0079024 | A1 * | 4/2007 | Wayner ............................ | 710/52 |
| 2007/0266202 | A1 * | 11/2007 | Mukaida ........................ | 711/103 |
| 2007/0283083 | A1 * | 12/2007 | Mukaida ........................ | 711/103 |
| 2008/0008001 | A1 * | 1/2008 | Kuroyanagi ............. | 365/185.11 |
| 2008/0046637 | A1 * | 2/2008 | Katano et al. ................. | 711/103 |
| 2008/0256352 | A1 * | 10/2008 | Chow et al. ....................... | 713/2 |
| 2009/0024899 | A1 * | 1/2009 | Reid ............................. | 714/758 |
| 2009/0172467 | A1 * | 7/2009 | Araki ................................ | 714/6 |

FOREIGN PATENT DOCUMENTS

| | | |
|---|---|---|
| JP | 2004013477 | 1/2004 |
| JP | 2004355560 | 12/2004 |
| JP | 2005-215824 | 8/2005 |
| JP | 2005215824 | 8/2005 |

OTHER PUBLICATIONS

JP Office Action dated Jul. 13, 2011 with English translation.

* cited by examiner

*Primary Examiner* — Christopher McCarthy
(74) *Attorney, Agent, or Firm* — Young & Thompson

(57) ABSTRACT

A semiconductor device is designed to provide an access control for a memory that includes a plurality of storage regions storing the same boot programs comprised of a set of program data. The semiconductor device is provided with a memory controller for reading out the program data from the storage regions, and an error detection circuit performing error detection on the program data read out. When the error detection circuit detects an error in one of the program data read out from one of the storage regions, the memory controller reads out the corresponding one of the program data from another of the storage regions.

12 Claims, 12 Drawing Sheets

Fig. 8
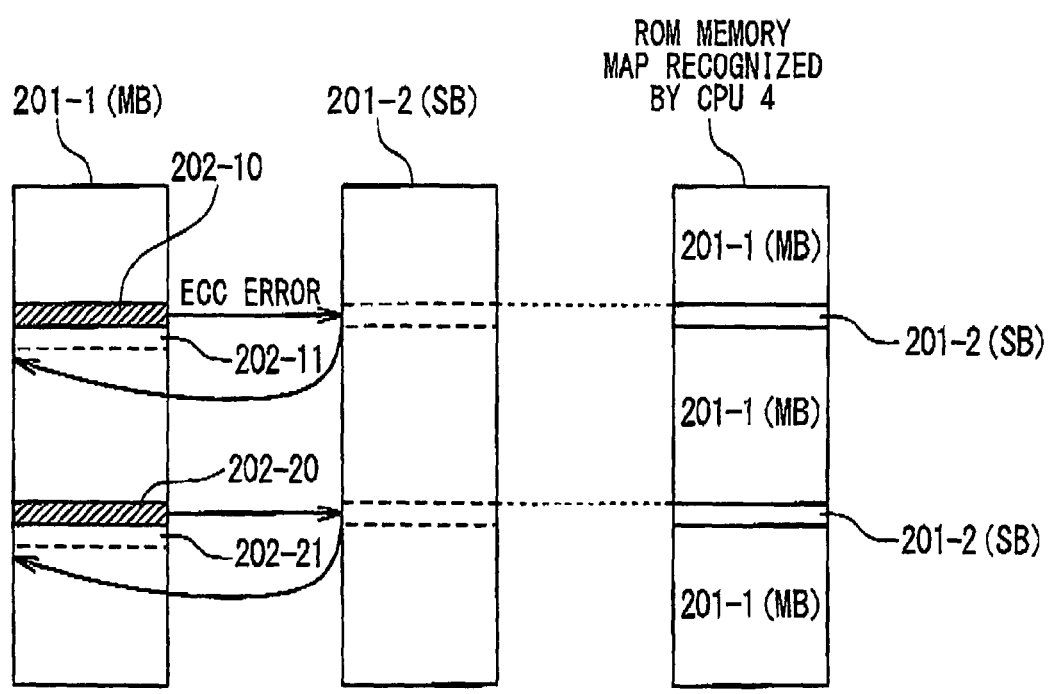
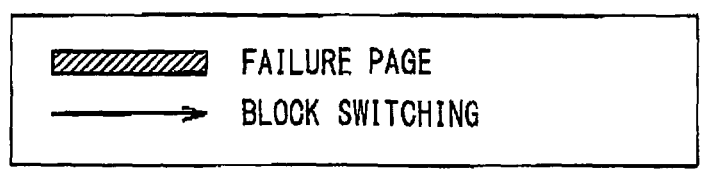

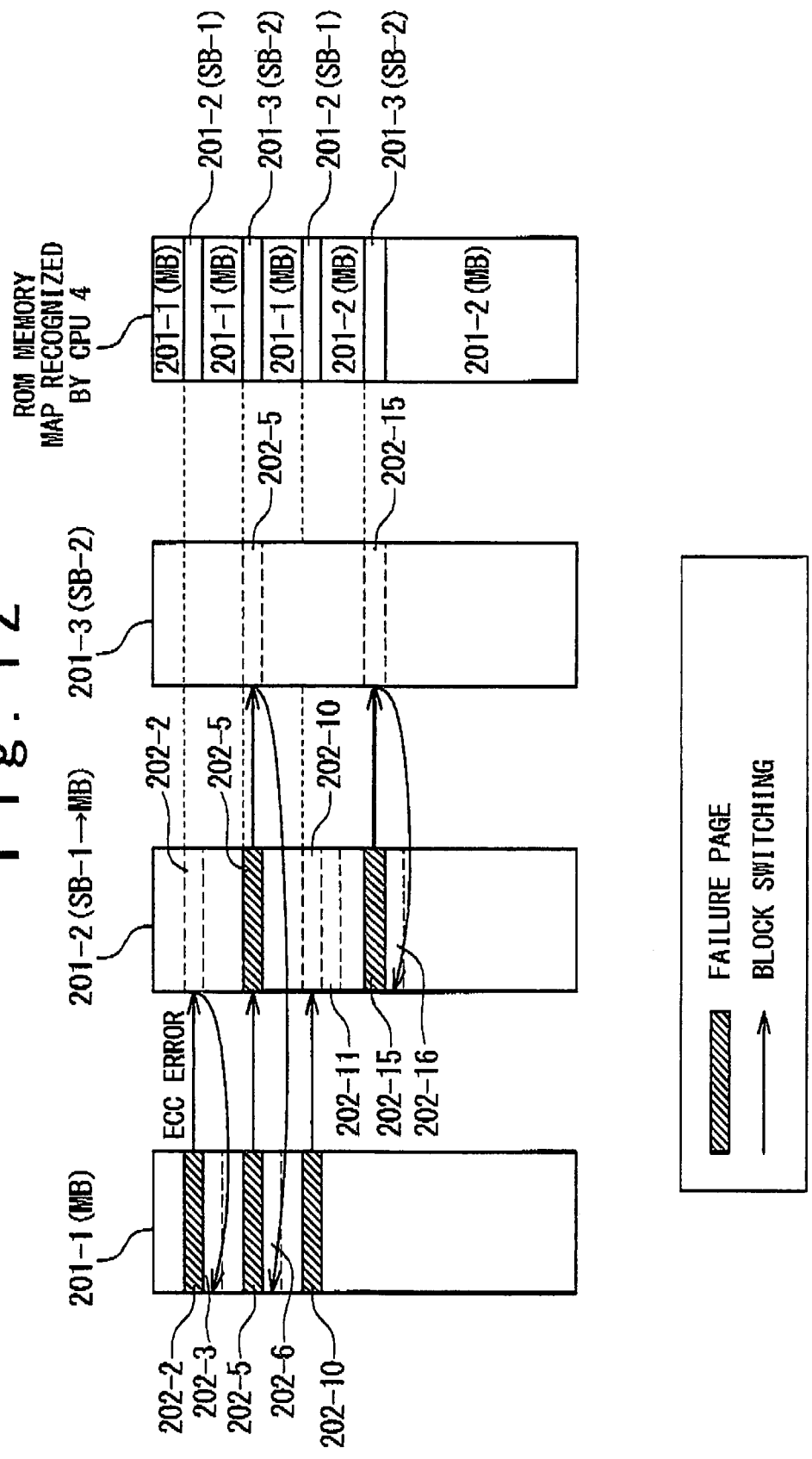

SEMICONDUCTOR DEVICE AND BOOT METHOD FOR THE SAME

BACKGROUND OF THE INVENTION

1. Field of the Invention

The present invention relates to a semiconductor device, and more particularly, relates to a technique for booting a semiconductor device using a boot program stored in a non-volatile memory.

2. Description of the Related Art

In recent years, system LSIs (large scale integrated circuits), which integrate various functions on a single chip, are designed to store various processing programs and data, such as a boot program, in an externally- or internally-provided non-volatile memory. As such a nonvolatile memory, a flash memory, which electrically rewrites and erases data, is often used.

Generally, NOR type flash memories are used for storing boot programs; however, NAND type flash memories, which are advantageous in the light of the cost, are also used for this purpose in recent days. One issue is that NAND type flash memories may suffer from an increased number of accidental defects due to manufacture, compared with NOR type flash memories. When a system LSI is booted with a boot program stored in an NAND type flash memory, it is required to assure that the block storing the boot program is not a failure block and the boot program is normally stored.

Data accesses to an NAND type flash memory are sequentially executed. Specifically, an access to an NAND type flash memory begins with specifying addresses for respective desired access cycles after entering a predefined command. This is followed by writing and/or reading data from or into pages corresponding to the specified addresses. Each specified address indicates the starting address of the corresponding page, and read and write operation of data are executed in units of pages. When a boot program is stored within multiple pages, a plurality of addresses are sequentially specified, and program data of the boot program stored in the plurality of pages are sequentially read out from the corresponding pages.

Disadvantageously, NAND-type flash memories suffer from increased bit errors, compared to NOR-type flash memories. First, NAND type flash memories tend to suffer from an increased number of manufacture defects. Second, in a NAND type flash memory, a set of memory cells are serially connected and this may result in that a failure memory cell causes a bit error of another memory cell. Bit lines of an NAND type flash memory are formed of serially-connected drains and sources of memory cells; no dedicated metal bit lines are provided within a memory array of an NAND type flash memory. Although effectively improving the cell size and integration degree, such structure undesirably increases the bit error rate. An NOR type flash memory, on the other hand, includes bitlines provided separately from memory cells for reading values of the memory cells. Such structure avoids a memory cell being affected by the state of another memory cell.

Therefore, WAND type flash memories often employ an error correction code (ECC) for reducing bit errors. The hamming code technique, which is used in smart mediums, is one simple example of the ECC technique. The use of the (7, 4) hamming code allows correcting one bit error, and detecting two random bit errors. In general, the error detection and correction by using the ECC technique is executed on dedicated hardware, such as an ECC circuit.

Japanese Laid-Open Patent Application No. Jp-A 2005-215824 (hereinafter, referred to as the '824 application) discloses a technique for booting a system LSI by using an NAND type flash memory. In this technique, the NAND type flash memory stores the same boot programs in multiple blocks. When an error is founded in the boot program read from a certain block, the boot program is read again from the starting page of another block. This allows stable booting, even when the NAND type flash memory includes one or more defective blocks.

More specifically, the system LSI disclosed in the '824 application includes a CPU that specifies a read address of a flash memory and a flash memory controller that obtains data from the specified read address of the flash memory. In the flash memory, the same boot programs are stored in multiple blocks. When the boot program is read out from a certain block, an ECC circuit in the flash memory controller performs error detection and correction for the boot program read out. When an error is detected, the read address is modified to reselect another block by an readdressing circuit. The flash memory controller obtains the boot program from the starting address of the reselected block, and transfers the obtained boot program to the CPU.

The drawback of this technique, which avoids bit errors in units of blocks, is that the boot program is not successfully read out when all of the respective blocks include a defective page, which results in undesirable termination of the booting process.

The following is a detailed description of this drawback for a case where the same boot programs are stored in first to third blocks each composed of $0^{th}$ to $31^{st}$ pages. When the ECC circuit finds an error in the data read from, for example, the $5^{th}$ page of the first block, the readdressing circuit modifies the read address to specify the starting address of the $0^{th}$ page of the second block. The flash memory controller reads the boot program from the second block in the order from the $0^{th}$ page to the $31^{th}$ page in accordance with the modified read address. When the ECC circuit finds another error in the data read from, for example, the $10^{th}$ page of the second block, the readdressing circuit modifies the read address to specify the $0^{th}$ page of the third block. In the same way, the flash memory controller finally reads the boot program from the third block in the order from the $0^{th}$ page to the $31^{th}$ page in accordance with the modified read address. When another error is found in the data read from the third block, however, this process results in that the boot program is not successfully read out from the flash memory.

SUMMARY

In an aspect of the present invention, a semiconductor device is designed to provide an access control for a memory that includes a plurality of storage regions storing the same boot programs comprised of a set of program data. The semiconductor device is provided with a memory controller for reading out the program data from the storage regions, and an error detection circuit performing error detection on the program data read out. When the error detection circuit detects an error in one of the program data read out from one of the storage regions, the memory controller reads out the corresponding one of the program data from another of the storage regions.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is a schematic diagram illustrating the read operation of the boot program data in the second embodiment;

FIG. 12 is a schematic diagram illustrating the read operation of the boot program data in the third embodiment.

DETAILED DESCRIPTION OR PREFERRED EMBODIMENTS

Figure 1:
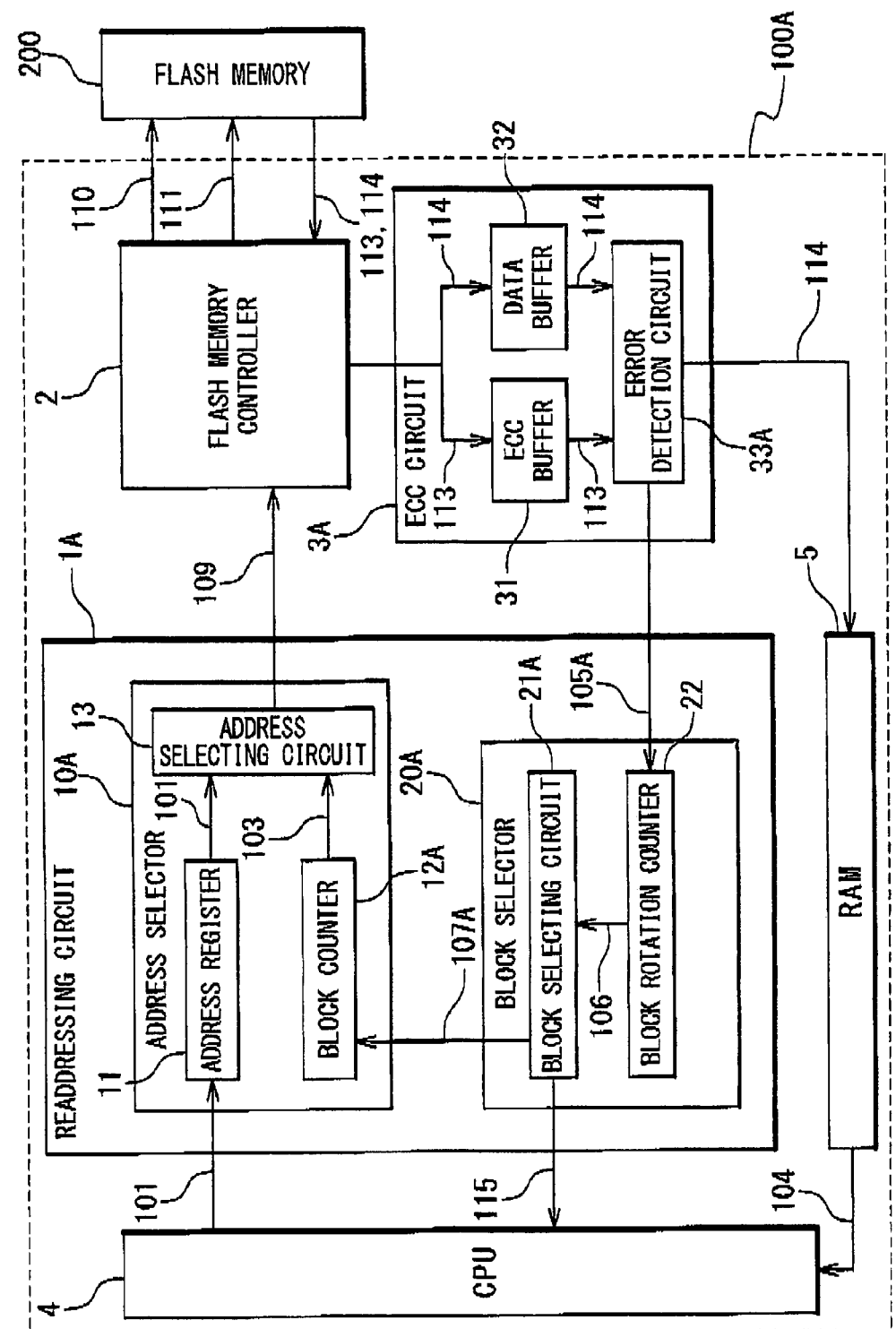
FIG. 1 is a block diagram illustrating the configuration of the semiconductor in a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

It should be noted that same or similar reference numerals in the drawings indicate same, similar, or equivalent components. The same numerals attached to a set of components collectively refer to the set of components. Hyphenated numbers may be attached with the reference numerals to distinguish the same components.

In the following embodiments, the present invention is directed to a semiconductor device which provides access control for an NAND type flash memory storing a boot program. It should be noted, however, that the present invention is applicable to semiconductor devices which provides access control for other kinds of memories.

First Embodiment

A semiconductor device according to a first embodiment of the present invention is designed to provide access control for an NAND type flash memory that includes first to n-th blocks storing the same boot programs. The semiconductor device is adapted to read data from the blocks. When finding error in data read out from a certain page of a certain block, the semiconductor device rereads the data from the corresponding page of the next block. It should be noted that, when finding an error in data read out from a certain page of the n-th block, the semiconductor device rereads the data from the corresponding page of the first block. Details of the semiconductor device according to the first embodiment will be explained below with reference to FIGS. 1 to 5.

(Device Configuration)

FIG. 1 is a block diagram illustrating the configuration of the semiconductor device according to the first embodiment of the present invention. The semiconductor device of the first embodiment includes a microcomputer 100A and a flash memory 200 storing a boot program used for booting the microcomputer 100A.

The microcomputer 100A includes a CPU (Central Processing Unit) 4, a readdressing circuit 1A, a flash memory controller 2, and an ECC circuit 3A, which are connected with each other through internal buses. Preferably, circuits of the microcomputer 100A are integrated within a single semiconductor chip. The microcomputer 100A and the flash memory 200 may be monolithically integrated within a single semiconductor chip. The CPU 4 is configured to access the flash memory 200 via an internal bus and to obtain a boot program from the flash memory 200, when executing the boot process of the system. The flash memory controller 2 controls the flash memory 200 on the basis of an address 101 and a block number 103, which are specified by the readdressing circuit 1A, and obtains the boot program from the flash memory 200. The ECC circuit 3A performs error detection on the boot program obtained from the flash memory 200. The readdressing circuit 1A specifies a destination block and destination page from which data are to be read, and informs the flash memory controller 2 of the destination block and destination page. The readdressing circuit 1A retains the address 101 specified by the CPU 4, and specifies the page 202 corresponding to the specified address 101 as the destination page. In addition, the readdressing circuit 1A determines the destination block in accordance with the result of the error detection for the data 114 performed by the ECC circuit 3A.

Figure 2:
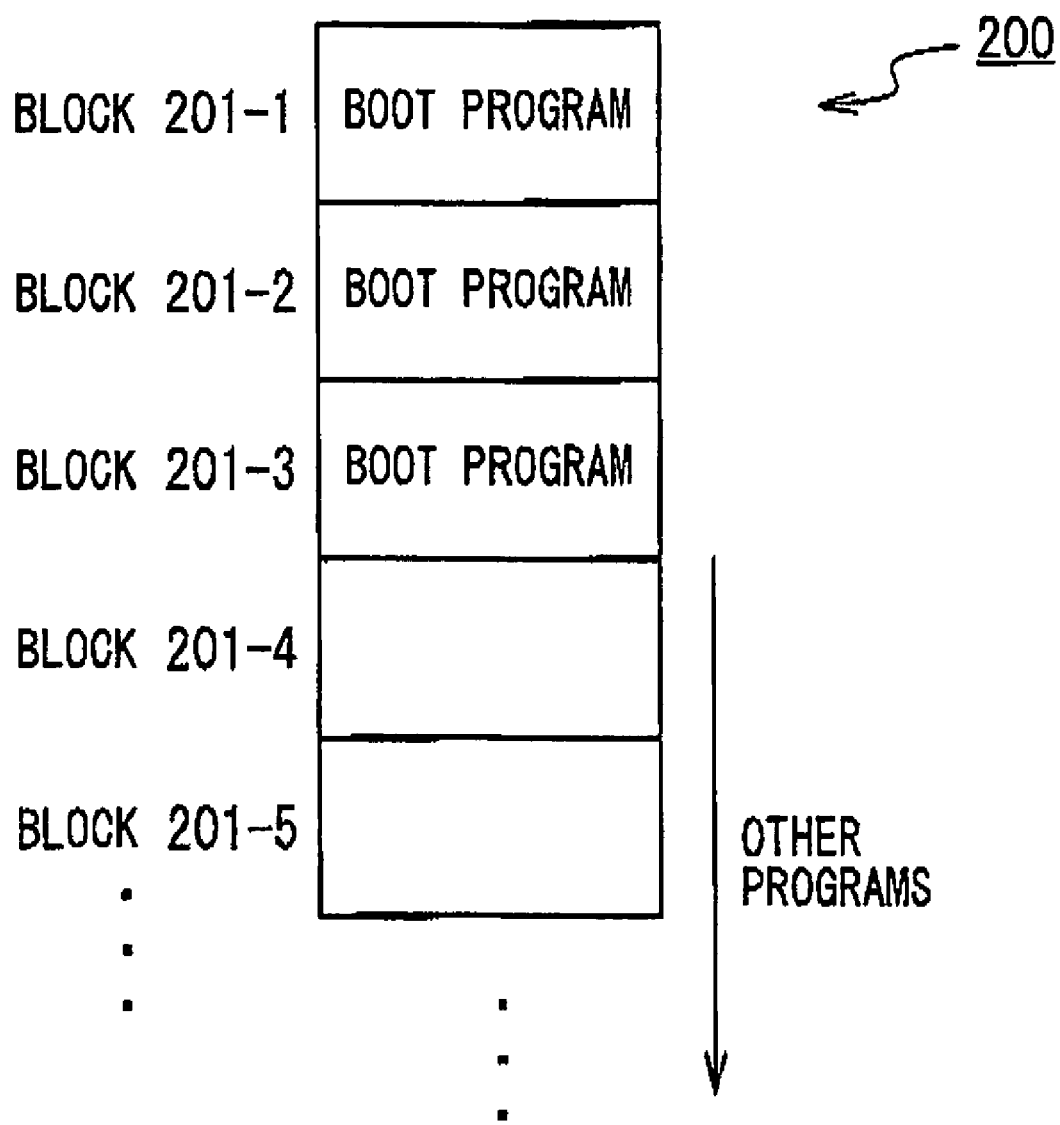
FIG. 2 illustrates an example of the structure of the flash memory in the first embodiment.

Referring to FIGS. 2 and 3, a description of the structure of the flash memory 200 is given in the following. FIG. 2 illustrates the memory array structure of the flash memory 200. The flash memory 200 includes a plurality of blocks 201-1 to 201-n. A predetermined number of blocks are used to store the same boot programs. In this embodiment, three blocks: the blocks 201-1 to 201-3 are used to store the same boot programs. The remaining blocks 201-4 to 201-n are used to store other programs and data. The blocks 201-1 to 201-n are identified by block numbers. In this embodiment, the block numbers of the respective blocks 201-1 to 201-n are defined as being identical to the hyphenated numbers attached with the reference numerals. For example, the block 201-1 is identified by the block number of one. It should be noted that the number of blocks used to store the same boot programs is not limited to three.

Figure 3A:
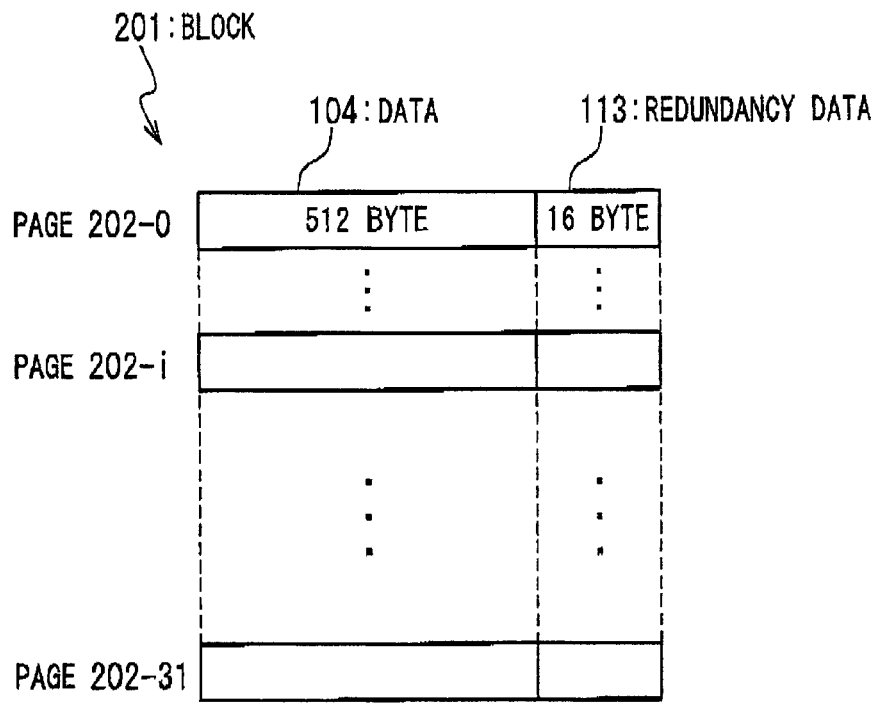
FIGS. 3A to 3C illustrate the structure of data stored in the blocks of the flash memory.

FIG. 3A illustrates the structure of the blocks 201. The blocks 201 are each composed of 32 pages 202-0 to 202-31. The pages 202-0 to 202-31 provide a storage region of 16 kbytes as a whole. It should be noted that the erase operation of the NAND flash memory 200 are performed in units of the blocks 201. The pages 202-0 to 202-31 are addressed by an address which ranges from 0 to 32, Data reading and writing from or into the NAND type flash memory 200 are executed in units of pages 202. Each page 202 stores data of 528 (=512+16) bytes. Specifically, each page 202 includes a data field storing 512-byte data 104 and a redundancy field storing a redundancy data 113 of 16 bytes.

The boot programs are each composed of a set of boot program data. The boot program data of the boot programs are stored in the pages 202-0 to 202-31 of the blocks 201 as the 512-byte data 104.

Figure 3B:
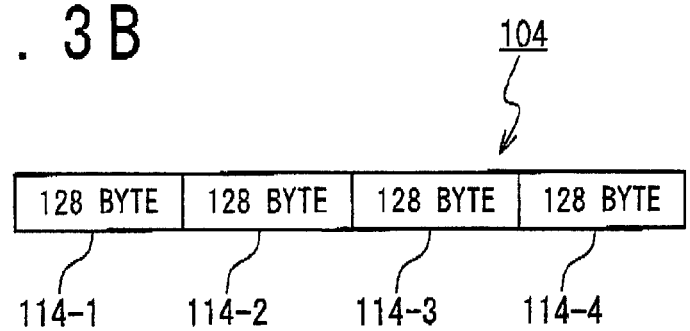
Figure 3C:
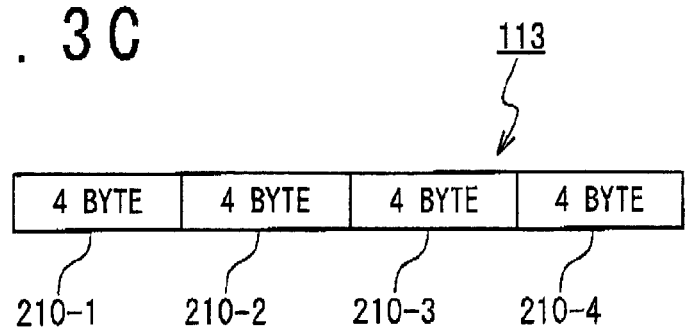

FIG. 3B illustrates the structure of the 512-byte data 104 stored in the pages 202 (which consist of the boot program data for the blocks 201-0 to 201-3), while FIG. 3C illustrates the structure of the redundancy data 113 stored in the pages 202. Referring to FIG. 3B, the 512-byte data 104 each consist of four 128-byte data 114-1 to 114-4. Referring to FIG. 3c, the redundancy data 113 includes four-byte ECC data 210-1 to 210-4 each composed of ECCs and other management data. The ECC circuit 3A performs error detection on the 128-byte data 114-1 to 114-4 by using the associated ECC data 210-1 to 210-4, respectively.

Referring back to FIG. 1, the ECC circuit 3A in the first embodiment includes an ECC buffer 31, a data buffer 32, and an error detection circuit 33A. The ECC buffer 31 stores the redundancy data 113 read from the flash memory 200. The data buffer 32 stores the 128-byte data 114 read from the flash memory 200. The error detection circuit 33A receives the 128-byte data 114 from the data buffer 32, and performs error detection on the 128-byte data 114 on the basis of the ECC 210 corresponding to the received 128-byte data 114. In addition, the ECC circuit 3A includes an error correction circuit (not shown), and performs error correction when detecting a correctable error (CE). The error detection circuit 33A issues an error notification signal 105A to the readdressing circuit 1A when determining that the 128-byte data 114 includes an uncorrectable error (UCE). When determining that the 128-byte data 114 include no uncorrectable error, the 128-byte data 114 are transferred and stored in the RAM 5 after the error correction if necessary. When the 128-byte data 104 (data 114-1 to 114-4) for one page are accumulated in the RAM 5, the RAM 5 forwards the data stored therein to the CPU 4. Hereinafter, a page 202 that suffers from an uncorrectable error is referred to as a failure page.

The readdressing circuit 1A includes an address selector 10A instructing the destination block and page to the flash memory controller 2, and a block selector 20A for selecting the destination block on the basis of the result of the error detection by the ECC circuit 3A.

The address selector 10A includes an address register 11, a block counter 12A, and an address selecting circuit 13. The address register 11 retains the address 101 specified by the CPU 4. Here, the address 101 is specified to indicate the starting address of the page 202 from which data are to be read. The block counter 12A provides the block number 103 identifying the destination block. In detail, the block counter 12A counts up in response to a block specification signal 107A received from the block selector 20A to increment the block number 103. When the block specification signal 107A is asserted after the block number 103 is incremented up to a predetermined value (for example, three), the block counter 12A is reset to an initial value (for example, the block number 103 is reset to one).

The address selecting circuit 13 specifies the destination block and page on the basis of the address 101 received from the address register and the block number 103 received from the block counter 12A. More specifically, the address selecting circuit 13 generates an address specifying signal 109 that incorporates the address 101 received from the address register 11 and the block number 103 received the block counter 12A, and feeds the address specifying signal 109 to the flash memory controller 2. The flash memory controller 2 accesses the destination page of the destination block of the flash memory 200, as specified by the address specifying signal 109.

The block selector 20A includes a block selecting circuit 21A and a block rotation counter 22. A block rotation counter 22 counts the number of times of switching the destination block from which the boot program data are to be read in order to avoid accessing a failure page; the number of times of the block switching is referred to as the number of times of block switching 106, hereinafter. The number of times of block switching 106 indicates the number of failure pages identified by the same address within the blocks 201-1 to 201-3, which store the same boot programs. In detail, the initial value of the block rotation counter 22 is zero (that is, the number of times of block switching 106 is initially set to zero) The block rotation counter 22 increments the number of times of block switching 106 by one in response to the assertion of the error notification signal 105A received from the ECC circuit 3A. The block rotation counter 22 is reset to the initial value when 512-byte data 104, composed of four 128-byte data 114, are transferred from the RAM 5 to the CPU 4. The block selecting circuit 21A functions to specify the destination block by controlling the block counter 12A depending on the number of times of block switching 106 contained in the block rotation counter 22.

When certain corresponding pages 202 of the block 201-1 to 201-3 specified by the same address are all determined as failure pages, the block selecting circuit 21A asserts an error signal 115 to instruct the CPU 4 to terminate the boot process. For example, the pages 202-5 of the block 201-1 to 201-3 are all determined as failure pages, the block selecting circuit 21A asserts the error signal 115. In detail, the block selecting circuit 21A retains the allowed maximum number of times of block switching TM, and asserts the block specification signal 107A to increment the block number 103 contained in the block counter 12A, when the number of times of block switching 106 is not increased up to the allowed maximum number of times of block switching TM. When the number of times of block switching 106 is increased up to the allowed maximum number of times of block switching TM, on the other hand, the block selecting circuit 21A asserts the error signal 115. Since there are three blocks for storing the boot program here, the allowed maximum number of times of block switching TM is three.

The flash memory controller 2 feeds to the flash memory 200 an address specifying signal 110 that indicates the address and block number for specifying the destination block, and page, in response to the address specifying signal 109. In addition, the flash memory controller 2 issues a read command 111 to instruct the flash memory 200 to perform read operation with the address specifying signal 110. The flash memory 200 retrieves the 512-byte data 104 and the redundancy data 113 from the page 202 specified by the address 101 out of the block 201 specified by the block number 103 indicated by the address specifying signal 110, and outputs the 512-byte data 104 and the redundancy data 113 to the flash memory controller 2. In detail, the flash memory 200 sequentially outputs the 128-byte data 114-1 to 114-4 of the 512-byte data 104 stored in the specified page 202, and the 128-byte data 114-1 to 114-4 are sequentially transferred to the ECC circuit 3A.

As described above, when an error is found in data obtained from a certain page specified by the address received from the CPU 4 out of a certain block, the readdressing circuit 1A newly specifies another block as the destination block, and switches the destination page to another page specified by the same address in the newly specified block. The readdressing circuit 1A continues data reading from the newly specified block. The readdressing circuit 1A switches the destination block, every when a failure page is found. When the failure page is found in the final block 201-3, the readdressing circuit 1A specifies the first block 201-1 as the destination block. When corresponding pages 202 of the blocks 201-1 to 201-3 specified by a certain address are all determined as failure pages, the readdressing circuit 1A asserts the error signal 115 to terminate the boot process.

(Device Operation)

Figure 4:
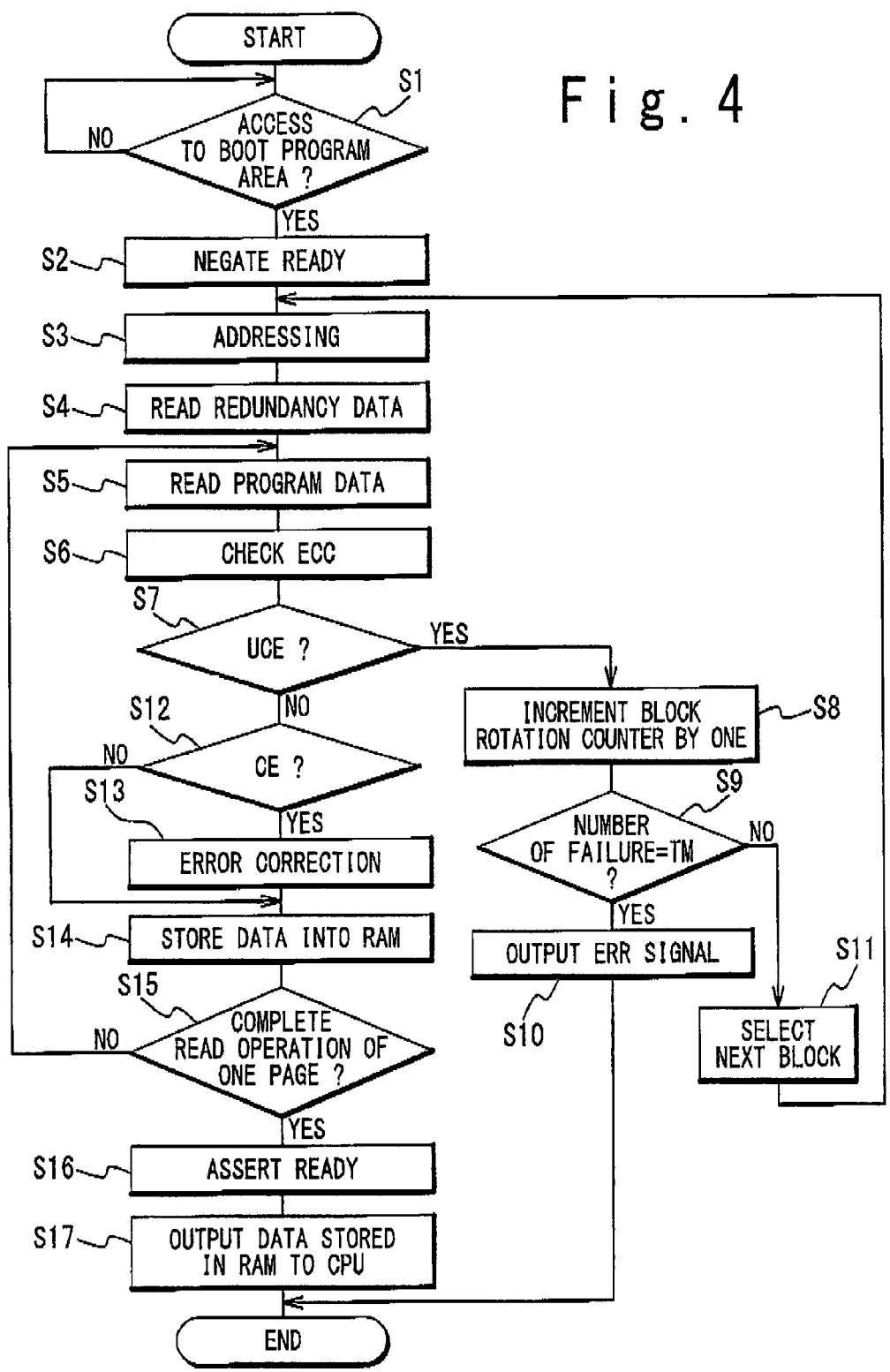
FIG. 4 is a flowchart illustrating the booting process of the semiconductor device in the first embodiment.
Figure 5:
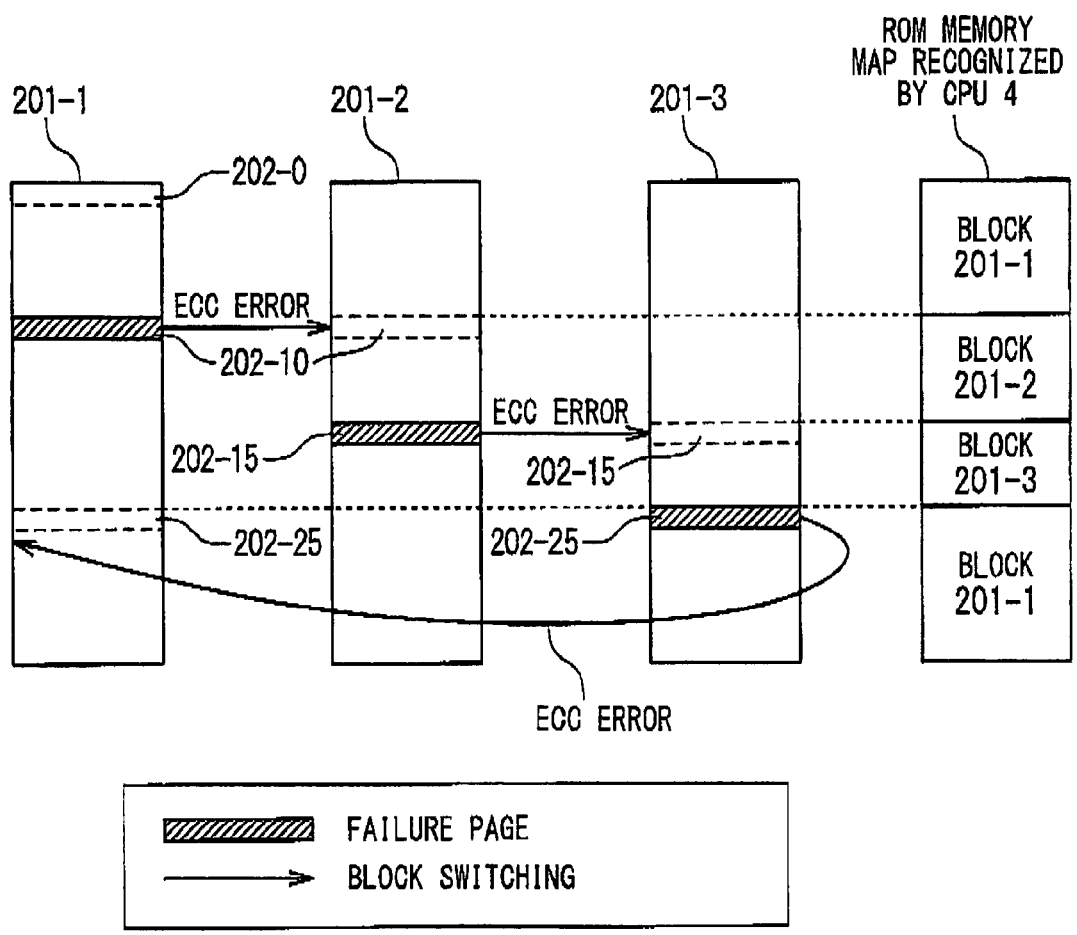
FIG. 5 is a schematic diagram illustrating the read operation of the boot program data in the first embodiment.

Referring to FIGS. 4 and 5, details of the boot process performed in the first embodiment will be explained below. FIG. 4 is a flowchart showing the procedure of reading the boot program, while FIG. 5 is a schematic diagram illustrating the destination block switching in the boot process. It should be noted that FIG. 4 illustrates the procedure of reading the boot program data from corresponding pages 202 of the blocks 201-1 to 201-3 specified by a certain address. It should be noted that the same boot programs are stored in the blocks 201-1 to 201-3 in this embodiment.

Referring to FIG. 4, when receiving a reset signal to initiate the system booting (including the power-on of the system and the rebooting of system), the CPU 4 starts an access to the flash memory 200 through the internal bus (step SI: Yes). The CPU 4 then negates a bus status signal READY (step S2) to prohibit accesses from a higher-level system to the internal bus.

The CPU 4 then specifies an address 101 to select a destination page from which the boot program data are to be read, and feeds the specified address 101 to the readdressing circuit 1A. In the readdressing circuit 1A, the specified address 101 is stored in the address register 11. The address selecting circuit 13 specifies the destination block and page with reference to the address register 11 and the block counter 12A in response to the address 101 being specified by the CPU 4 (step S3). Initially, the address 101, stored in the address register 11, is set to zero to specify the pages 202-0 of the blocks 201-1 to 202-3, and the block number 103 contained in the block counter 12A is set to one. The address selecting circuit 13 issues, to the flash memory controller 2, the address specifying signal 109 to indicate that the block number 103 is set to 1 and the address 101 is set to zero to specify the page 202-0 of the block 201-1 as the destination page.

The flash memory controller 2 feeds the address specifying signal 110 and the read command 111 to the flash memory 200 in response to the address specifying signal 109. The flash memory 200 outputs to the ECC circuit 3A the redundancy data 113 and the 512-byte data 104 stored in the page 202 specified by the address 101 and the block number 103, as specified by the address specifying signal 110 fed from the flash memory controller 2. More specifically, the flash memory 200 selects the page 202-0 of the block 201-1 in response to the address specifying signal 110. In addition, the flash memory 200 outputs the 128-byte data 114-1 and the redundancy data 113 stored in the page 202-0 to the flash memory controller 2, in response to the read command 111. The redundancy data 113 includes the ECC data 210-1 to 210-4. The flash memory controller 2 stores the outputted redundancy data 113 in the ECC buffer 31 (step S4), and stores the 128-byte data 114-1 in the data buffer 32 (step S5).

The error detection circuit 33A reads the redundancy data 113 from the ECC buffer 31. The error detection circuit 33A then reads the 128-byte data 114-1, which are 128-byte boot program data, from the data buffer 32. The error detection circuit 33A performs error detection on the 128-byte data 114-1 by using the ECC 210-1 corresponding to the 128-byte data 114-1 (step S6). This error detection includes detection of an uncorrectable error (UCE) (step S7), and detection of a correctable error (CE).

When the 128-byte data 114-1 are determined to include no UCE at step S7, the process proceeds to step 12 (step S7: NO). When the 128-byte data 114-1 are determined to include a CE at step S12, an error correction is performed on the 128-byte data 114-1, and the corrected 126-byte data 114-1 are stored in the RAM 5 (steps S13 and S14). When the 128-byte data 114-1 are determined to include no error in at step S12, the error detection circuit 33A stores the 128-byte data 114-1 in the RAM 5 (step S14).

When the 128-byte data 114-1 are determined to include an UCE at step S7, the error detection circuit 33A asserts the error notification signal 105A and increments the block rotation counter 22 by one (step S8). The block selecting circuit 21A refers to the block rotation counter 22, and determines whether the number of times of block switching 106 is increased up to the allowed maximum number of times of block switching TM (step S9). When the number of times of block switching 106 is increased up to allowed maximum number of times of block switching:TM (=3, in this embodiment) (step S9: Yes), the block selecting circuit 21A assert the error signal 115, which fed to the CPU 4 (step S10). When all of the corresponding pages 202 of the blocks 201-1 to 201-3 specified by the same address are determined as failure pages, the block selecting circuit 21A asserts the error signal 115 to terminate the read operation of the boot program.

When the number of times of block switching 106 is not increased up to the maximum allowed number of times of block switching TM (step S9: No), the block selecting circuit 21A updates the block counter 12A, and specifies the next block 201-2 as the destination block. The block number 103 contained in the block counter 12A is incremented by one in response to the block specification signal 107A being asserted. After the block counter 12A is updated, the address selecting circuit 13 reissue the address specifying signal 109 in accordance with the updated block number 103 stored in the block counter 12A and the address 101 stored in the address register 11 (step S3). In detail, the address selecting circuit 13 reissues the address specifying signal 109 that specifies the page 202-0 of the block 201-2 as the destination page on the basis of the updated block number 103 and the address 101. It should be noted that the block number 103 is updated to two and the address 101 is set to zero, in this operation. Subsequently, the process proceeds to steps S4 to S6. The 128-byte data 114-1 and the redundancy data 113 are obtained from the page 202-0 in the block 201-2, and the error detection circuit 33A performs error detection on the obtained data 114-1.

After the 128-byte data 114-1 are stored in the RAM S at step S14, the procedure jumps to step S5. The error detection circuit 33A obtains the 128-byte data 114-2 from the page 202-0 of the block 201-2, and then performs error detection by using the corresponding ECC data 210-2. When no error is found, the 128-byte data 114-2 are stored in the RAM S (step S5 to S14). Step S5 to step S14 are repeated for the respective 128-byte data 114-1 to 114-4 until the complete set of the 128-byte data 114-1 to 114-4 read from the page 202-0 of the block 201-2 are prepared in the RAM 5. After the 512-byte data 104 for one page, which are composed of the 128-byte data 114-1 to 114-4, are prepared in the RAM 5 (step S15: Yes), a bus condition signal is asserted (step S16), and the 512-byte data 104 are transferred from the RAM 5 to the CPU 4 (step S17). After the 512-byte data 104 are transferred, the block rotation counter 22 is reset to the initial value.

As described above, the microcomputer 100A is configured to store the address 101 specified by the CPU 4 in the address register 11, to read the boot program data from the destination page specified the address, and to perform-error-detection on the boot program data in units of 128-byte data each associated with ECC data. When a failure page is detected, the destination block is switched, and the boot program data are read from the page 202 specified by the address 101 again. In addition, when corresponding pages of the blocks 201-1 to 201-3 are all determined as failure pages, the error signal 115 is asserted and the boot process is terminated.

For the case when the boot programs are each stored in multiple pages of the respective blocks 201-1 to 201-3, (for example, all of the pages 202-0 to 202-31 of the respective blocks 201-1 to 201-3), the CPU 4 specifies another address 101 corresponding to the next page after receiving the 512-byte data 104 from the RAM 5, and provides the newly specified address 101 for the readdressing circuit 1A. The address register 11 stores the newly specified address 101, and the procedure is jumped to step S3. The address selecting circuit 13 specifies the destination block and page on the basis of and the address 101 updated by the CPU 4 and the block number 103 specified by the block counter 12A during the previous read operation. In the same way as described above, the microcomputer 100A sequentially reads the-boot program from the pages 202-0 to 202-31 of any of the block 201-1 to 201-3 to execute the boot process.

FIG. 5 is a schematic view illustrating the process of reading the boot program data in the first embodiment. FIG. 5 illustrates the switching of destination blocks and pages from which the boot program data are read out. A description is given of an example of the procedure of switching destination blocks and pages in the first embodiment with reference to FIGS. 4 and 5. In the following, it is assumed that the page 202-10 of the block 201-1, the page 202-15 of the block 201-2, and the page 202-25 of the block 201-3 are failure pages.

When steps S2 to S17 are repeated after the boot process is initiated, and the boot program data are successively read from the block 201-1 in the order from the page 202-0 to the page 202-9, and transferred to the CPU 4. When the page 202-10 of the block 201-1 is determined as a failure page by the error detection circuit 33A, the readdressing circuit 1A switches the destination block to the block 201-2 at step S11. Subsequently, steps S2 to S17 are repeated, and boot program data are read from the block 201-2 in the order from the page 202-10 to the page 202-14. When the page 202-15 of the block 201-2 is determined as a failure page, the readdressing circuit 1A switches the destination block to the block 201-3. Subsequently, steps S2 to S17 are repeated, and boot program data are read from the block 201-3 in the order from the page 202-15 to the page 202-24.

When the page 202-25 of-the final block 201-3 is determined as a failure page, the readdressing circuit 1A specifies the block 201-1 again as the destination block. In detail, when the block number 103 contained in the block counter 12A indicates three at step 11 and the block specification signal 107A is asserted by the block selecting circuit 21A, the block counter 12A is reset to the initial value, resulting in the block number 103 is set to one to specify the block 201-1. At the following step 53, the address selecting circuit 13 issues the address specifying signal 109 on the basis of the address 101 stored in the address register 11 and the block number 103 indicated by the block counter 12A. In this case, the address 101 is set to 25, and the block number 103 is set to one. The procedure proceeds to step S4, and the CPU 4 successively reads the boot program data from the page 202-25 to the page 202-31 of the block 201-1.

As described above, the microcomputer 100A is configured to switch the destination block in reading the boot program stored in the pages 202-0 to 202-31 from the flash memory 200, every when a failure page is found. In the case of FIG. 5, the pages accessed by the CPU 4 in reading the boot program are the pages 202-0 to 202-9 and the pages 202-25 of 31 of the block 201-1, the pages 202-10 to 202-14 of the block 201-2, and the pages 202-15 to 202-24 of the block 201-3.

In the following, a description is given of a case that the corresponding pages 202 of all the blocks 201-1 to 201-3 (for example, the page 202-5 of all the blocks 201-1 to 201-3) are failure pages. When the page 202-5 of the block 201-1 is determined as a failure page, the block rotation counter 22 is incremented by one to indicate the number of times of block switching 106; the number of times of block switching 106 is set to one. Since the number of times of block switching 106 is not increased up to the allowed maximum number of times of block switching TM (=3), the block selecting circuit 21A increments the block counter 12A by one, and determines the block 201-2 as the destination block. Subsequently, when the page 202-5 of the block 201-2 is determined as a failure page, the block rotation counter 22 is incremented again to set the number of times of block switching 106 to two. Since the number of times of block switching 106 is not increased up to the allowed maximum number of times of block switching TM (=3), the block selecting circuit 21A increments the block counter 12A, and determines the block 201-3 as the destination block. Subsequently, when the page 202-5 of the block 201-3 is determined as a failure page, the block rotation counter 22 is incremented to set the number of times of block switching 106 to three. Since the number of times of block switching 106 is increased up to the allowed maximum number of times of block switching TM, the block selecting circuit 21A asserts the error signal 115 to indicate the CPU 4 to stop the boot process.

As described above, the microcomputer 100A of the first embodiment allows successfully reading the boot program, even if all the blocks 201, which store the same boot programs, each include a failure page, unless all of the corresponding pages of the blocks 201 specified by the same address are failure pages. This allows stable boot process which involves reading the boot program from the NAND type flash memory 200.

Additionally, the microcomputer 100A of the first embodiment is configured to switch the destination block, every when detecting a failure page, and to cyclically select the destination block out of the blocks 201-1 to 201-3; after a certain page of the block 201-3 is determined as a failure page, the block 201-1 is selected again as the destination block. This allows reducing the number of blocks prepared for storing the boot programs and thereby effectively utilizing the memory resource. It should be noted that the boot process stops when all the blocks are determined as each including a failure page.

It should be noted that the device and method of the first embodiment is applicable to a semiconductor device configured to read data and programs in sequence, although the first embodiment is directed to a semiconductor device which reads a boot program from the NAND type flash memory.

In order to clarify the advantage of the architecture of the microcomputer 100A of this embodiment, the microcomputer 100A of this embodiment is compared with the technique described in Japanese Laid-Open Patent Application No. Jp-A 2005-215824 in terms of the probability of boot failure resulting from an unsuccessful read operation of the boot program stored in the NAND flash memory.

For the technique of the '824 application, the boot process is unsuccessfully completed when all of the blocks includes a failure page. Therefore, the probability in which the boot process is unsuccessfully completed is:

$$1/(_nC_n + {_nC_{n-1}} + {_nC_{n-2}} + \ldots + {_nC_2} + {_nC_1}),$$

where n is the number of blocks used to store the.

For a case where three blocks are prepared for storing the boot programs, for example, in which the boot process is unsuccessfully completed is as follows;

$$1/(_3C_3+_3C_2+_3C_1)=1/8=12.5\%.$$

For the architecture of the first embodiment, on the other hand, the boot process is unsuccessfully completed when all the blocks each include a failure page, and the failure pages correspond to the same address. When each block includes 32 pages, the probability in which the boot process is unsuccessfully completed is $1/32^{n-1}$.

For a case when three blocks are prepared for storing the boot programs, for example, the probability in which the boot process is unsuccessfully completed is as follows:

$$1/32^{3-1}=0.98\%.$$

As described above, the architecture of the semiconductor device of the first embodiment considerably reduces the probability in which the boot process is unsuccessfully completed because of failure pages. Therefore, the stable boot process can be realized even when an NAND type flash memory, which comparatively has a higher failure probability, is used to store a boot program. In addition, the architecture of the semiconductor device of the first embodiment effectively avoids data errors, not only for errors caused by the memory manufacture process, but also for errors caused by rewriting the boot program at the point of use, the defective can be avoided. Furthermore, the architecture of the semiconductor device of the first embodiment effectively improves the reliability of rewriting the boot program, since the destination block is switched when a failure page is detected.

Second Embodiment

Figure 6:
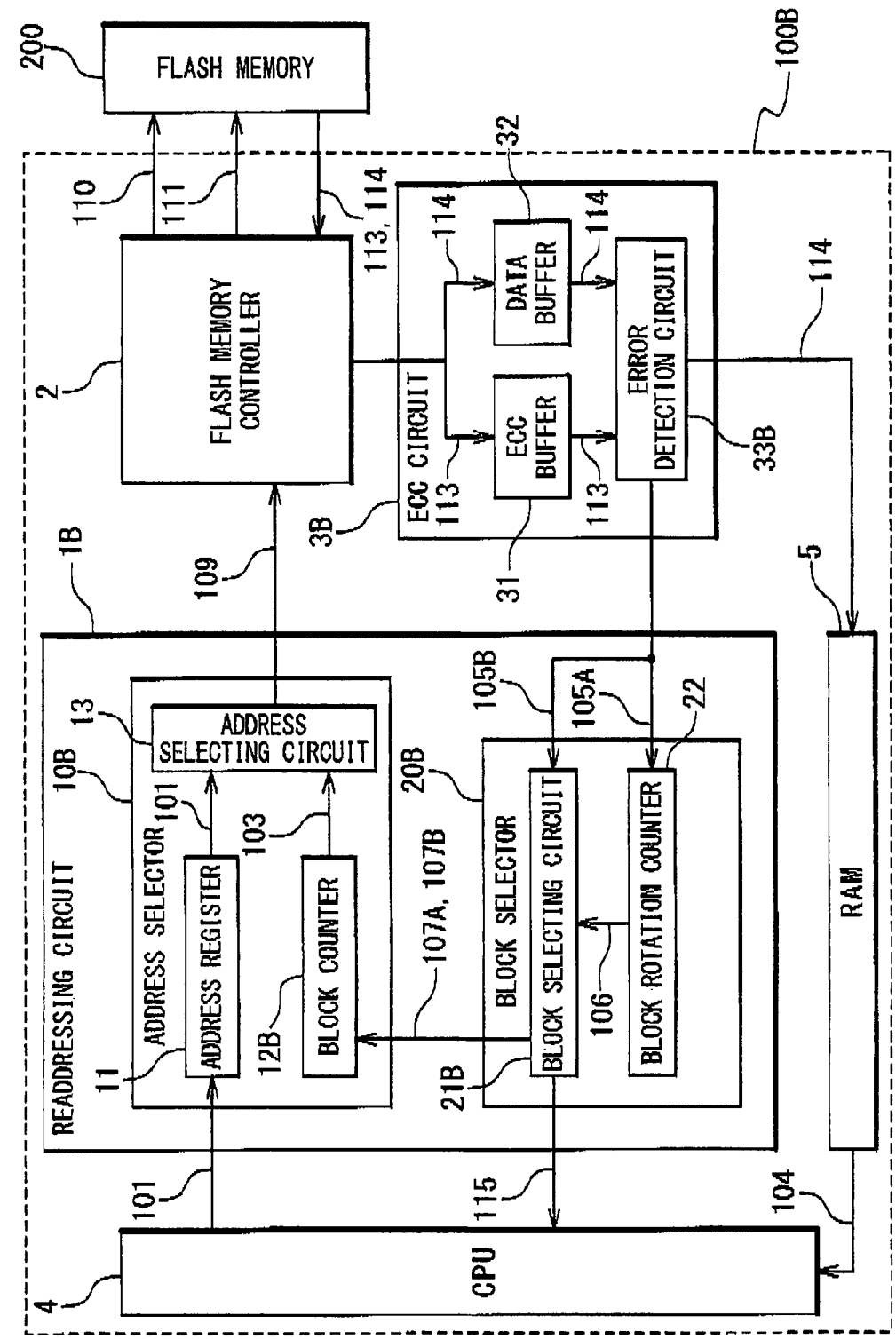
FIG. 6 is a block diagram illustrating the configuration of the semiconductor in a second embodiment of the present invention.

A semiconductor device according to a second embodiment includes an NAND type flash memory having a plurality of blocks storing the same boot programs. When an error is detected in a certain page of a certain block, the semiconductor device according to a second embodiment rereads the boot program data from the corresponding page of another block. In the semiconductor device in the second embodiment, one of the blocks, referred to as a main block MB, is specified as the destination block in the default operation. When a failure page is found in the main block MB, the destination block is switched to another block, referred to as a sub block SB, to avoid data error. Referring to FIGS. 6 and 8, details of the semiconductor device in the second embodiment will be explained below.

(Device Configuration)

FIG. 6 illustrates the device structure of the semiconductor device in the second embodiment of the semiconductor device. The semiconductor device in the second embodiment includes a microcomputer 100B and a flash memory 200 for storing the boot program used for the booting of the microcomputer 100B. It is preferable that circuits within the microcomputer 1008 are integrated within a single semiconductor chip. The microcomputer 100B and the flash memory 200 may be monolithically integrated in a single semiconductor chip. The microcomputer 100B in the second embodiment includes a readdressing circuit 1B and an ECC circuit 3B instead of the readdressing circuit 1A and the ECC circuit 3A in the first embodiment. Components of the microcomputer 100B denoted by the same reference numerals as those in the microcomputer 100A of the first embodiment operate in the similar way, and therefore detailed explanations of such components are not given in the following. In the second embodiment, the same boot programs are duplicatedly stored in a pair of blocks 201-1 and 201-2 in the flash memory 200.

The readdressing circuit 1B in the second embodiment includes an address selector 10B and a block selector 20B. The address selector 10B specifies the destination block and page from which the boot program data are to be read on the basis of the result of the error detection in the ECC circuit 3B. The block selector 20B selects the destination block. In the default operation, the readdressing circuit 1B specifies the main block MB as the destination block. When a failure page is found in the main block MB, the readdressing circuit 1B specifies the sub block SB as the destination block. After the boot program data are read from the corresponding page of the sub block SB, the main block MB is specified again as the destination block.

The address selector 10B includes an address register 11, a block counter 12B, and an address selecting circuit 13. The block counter 12B updates a block number 103 in response to block specification signals 107A and 107B received from the block selector 20B. In one embodiment, the block counter 12B is set to the block number of the main block MB in response to the assertion of the block specification signal 107B, and is set to the block number of the sub block SB in response to the assertion of the block specification signal 107A. In detail, the block counter 12B is initially set to an initial value which is identical to the block number of the main block MB. The block counter 12B is counted up in response to the assertion of the block specification signal 107A. The block counter 12B is reset to the initial value in response to the assertion of the block specification signal 107B. The address selecting circuit 13 issues an address specifying signal 109 to the flash memory controller 2, in response to the address 101 contained in the address register 11 and the block number 103 contained in the block counter 12B. It should be noted that the address 101 contained in the address register 11 specifies the destination page. The flash memory controller 2 accesses the destination page of the destination 201 of the flash memory 200, as specified by the address specifying signal 109.

The block selector 20B includes a block selecting circuit 21B and a block rotation counter 22. The block rotation counter 22 counts the number of times of block switching 106 in response to the failure notification signal 105A. The block selecting circuit 21B specifies the destination block in accordance with the number of times of block switching 106 indicated by the block rotation counter 22 and a data output notification signal 105B received from the ECC circuit 3B.

When a failure page is detected by the ECC circuit 3B, the block selecting circuit 21B asserts the block specification signal 107A, which fed to the block counter 12B. The block counter 12B increments the block number 103 in response to the assertion of the block specification signal 107A. In addition, when all the corresponding pages of the blocks 201-1 and 201-2 specified by the same address are determined as failure pages, the block selecting circuit 21B instructs the CPU 4 to terminate the boot process by asserting the error signal 115. In detail, the block selecting circuit 21B retains the allowed maximum number of block switching TM, and asserts the error signal-115 when the number of times of block switching 106 is increased up to the allowed maximum number of times of block switching TM. In this embodiment, the allowed maximum number of times of block switching TM is two, since two blocks 210 (that is, the main block MB and the sub block SB) are used for storing the same boot programs.

When the number of times of block switching 106 is not increased up to the allowed maximum number of times of block switching TM after a failure page is founded, that is, when a failure page is found in the main block MB, the block selecting circuit 21B specifies the sub block SB as the destination block. In this case, the block selecting circuit 21B asserts the block specification signal 107A, which is fed to the block counter 12B. The block counter 12B increments the block number contained therein, in response to the assertion the block specification signal 107A.

After the 512-byte data 104 for one page are completely prepared in the RAM 5, the block selecting circuit 21B specifies the main block MB again as the destination block from which the boot program data are to be read next. In detail, after outputting the complete set of the data 114-1 to 114-4 one page to the RAM 5, the ECC circuit 3B asserts the data output notification signal 105B, which is fed to the block selecting circuit 21B. The block selecting circuit 21B asserts the block specification signal 107B to reset the block number 103 to the initial value.

The ECC circuit 3B includes an ECC buffer 31, a data buffer 32, and an error detection circuit 33B. The error detection circuit 33B sequentially receives the 128-byte data 114 from the data buffer 32, and performs error detection on the received 128-byte data 114 by using the ECC data 210 corresponding to the received data 114. In addition, the error detection circuit 33B includes a correction circuit (not shown), and performs error correction when detecting a CE (correctable error). When determining the received 128-byte data 114 include an UCE (uncorrectable error), the error detection circuit 33B asserts the failure notification signal 105A, which is fed to the block rotation counter 22. When determining the received data 114 does not include the UCE, on the other hand, the error detection circuit 33B transfers the 128-byte data 114 to the RAM 5 after error correction if necessary. When transferring the 128-byte data 114-4 to the RAM 5, the error detection circuit 33B asserts the data output notification signal 105B, which is fed to the block selecting circuit 21B.

As described above, the readdressing circuit 1B in the second embodiment switches the destination page from the page of the main block MB specified by the address 101 to the corresponding page of the sub block SB specified by the address 101, when a data error is found in the data read from the page of the main block MB. Specifically, in the default operation, the readdressing circuit 1B specifies the block 201-1, which is the main block MB, as the destination block. When a failure page is detected in the main block MB, the destination page is switch to the corresponding page of the block 201-2 (that is, the sub block SB) specified by the same address as the failure page found. When the 512-byte data 104 read from the sub block SB are transferred to the CPU 4, the main block MB is specified again as the destination block from which the program data are to be read next, and the boot program data are then read from the page next to the failure page of the main block MB. When a failure page is detected in the sub block SB, the readdressing circuit 1B asserts the error signal 115 to instruct the CPU 4 to terminate the boot process.

(Operation)

Figure 7:
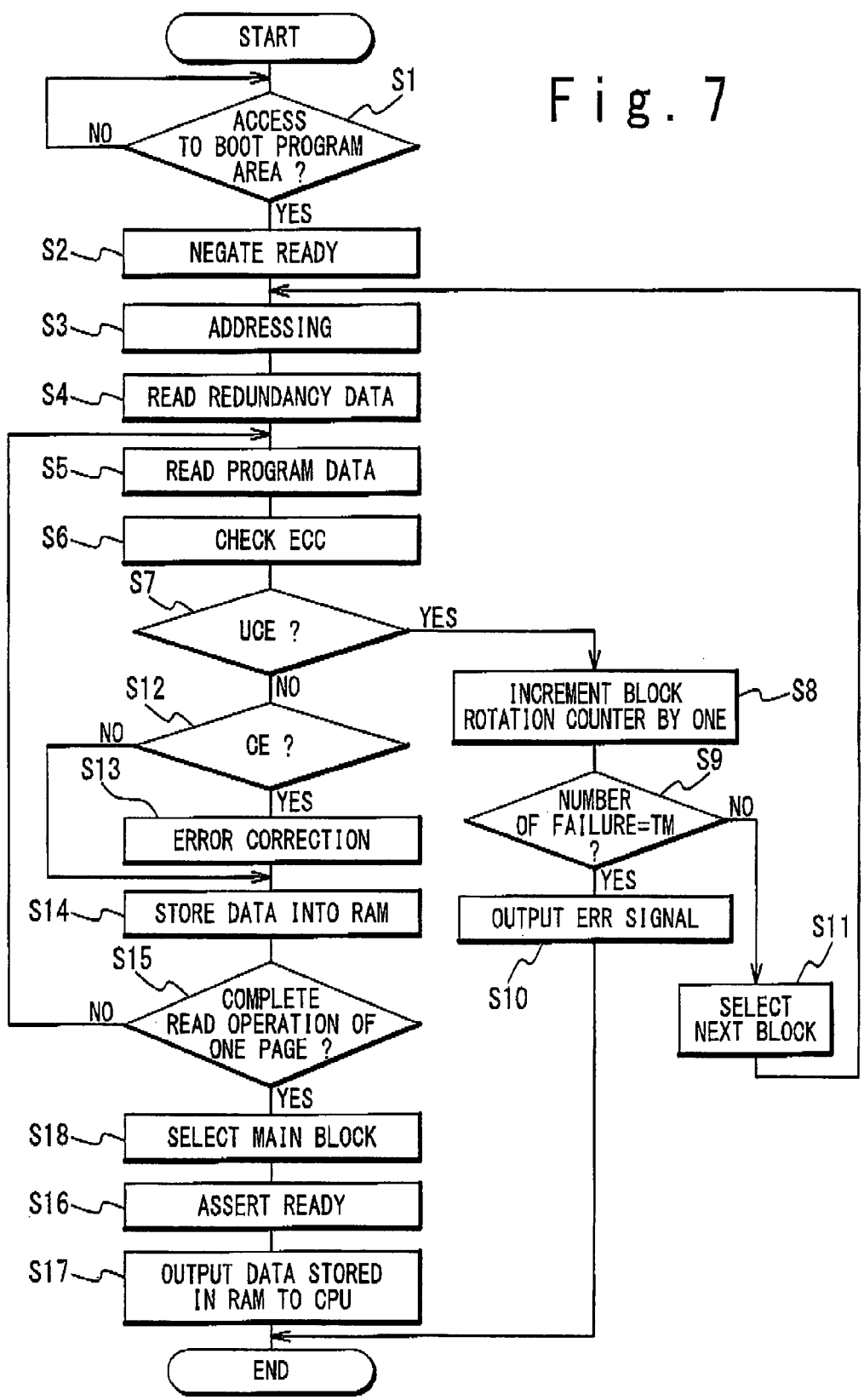
FIG. 7 is a flowchart illustrating the booting process of the semiconductor device in the second embodiment.

Referring to FIGS. 7 and 8, a detailed description of the procedure of the boot process in the second embodiment is given in the following. FIG. 7 is a flowchart showing the procedure of the boot process in the second embodiment, and FIG. 6 is a schematic diagram illustrating the destination block switching in the read operation of the boot program in the second embodiment. In this embodiment, the same boot programs are duplicatedly stored in the blocks 201-1 and 201-2, and the block 201-1 is defined as the main block MB while the block 201-2 is defined as the sub block SB. In FIG. 7, the same operations are performed in the steps denoted by the same reference numerals as those in the first embodiment, and detailed explanations thereof are not given in the following.

Referring to FIG. 7, the CPU 4 starts to access the flash memory 200 via the internal bus, in response to a reset signal being asserted in the system booting (including the power-on of the system and the rebooting of the system). Subsequently, step S1 to step S15 are repeated in the same way as the first embodiment, and the 128-byte data 114-1 to 114-4 are sequentially read from the page 202 of the block 201-1 specified by the address 101 contained in the address register 11, and transferred to the RAM 5. When the complete set of the 128-byte data 114-1 to 114-4 are prepared in the RAM 5 and then transferred to the CPU 4, the block selecting circuit 21B specifies the block 201-1 (the main block MB) as the destination block from which the program data are to be read next (step S18). In detail, the error detection circuit 33B asserts the data output notification signal 105B, which is fed to the block selecting circuit 21B, when the 128-byte data 114-4 are transferred to the RAM 5. In response to the data output notification signal 105B, the block selecting circuit 21B asserts the block specification signal 107B, which is fed to the block counter 12B. In response to the assertion of the block specification signal 107B, the block counter 12B is reset to the initial value, which is identical to the block number 103 of the main block MB (in this embodiment, the block number 103 of the block 201-1, that is, one) As a result, the readdressing circuit 1B specifies the main block MB (the block 201-1) as the destination block, when the boot program data are then read from the page specified next by the CPU 4.

When the 512-byte data 104 for the specified page are completely transferred from the flash memory 200 to the RAM 5 (step S15: Yes), a bus state signal is asserted (step S16), and the 512-byte data 104 are transferred from the RAM 5 to the CPU 4 (step S17). After the 512-byte data 104 are transferred from the RAM 5 to the CPU 4, the block rotation counter 22 is reset to the initial value.

As described above, the microcomputer 100B is configured to store the address 101 specified by the CPU 4 in the address register 11, to read the boot program data from the page specified by the address 101, and to perform error detection on the boot program data in-units of 128-byte data each associated with ECC data. When a failure page is detected, the destination block is switched from the main block MB to the sub block SB, and the boot program data are read from the page 202 of the sub block SB specified by the same address 101 again. When the 512-byte data 104 for one page are completely read from the sub block SB, the destination block is switched back to the main block MB. When corresponding pages of the main block MB and sub block SB are both determined as failure pages, the error signal 115 is asserted to the boot process is terminated.

When the boot programs are each stored in multiple pages of the blocks 201-1 and 201-2, (for example, all of the pages 202-0 to 202-31 of the blocks 201-1 and 201-2), the CPU 4 specifies another address 101 corresponding to the next page after receiving the 512-byte data 104 from the RAM 5, and provides the newly specified address 101 for the readdressing circuit 1B. The address register 11 stores the newly specified address 101, and the procedure is jumped to step S3. The address selecting circuit 13 specifies the destination page on the basis of the address 101 updated by the CPU 4 and the block number 103 specified by the block counter 12B in the previous read operation. In the same way as described above, the microcomputer 100B sequentially reads the boot program data from the pages 202-0 to 202-31 of any of the blocks 201-1 and 201-2 to execute the boot process.

FIG. 8 is a schematic diagram illustrating the block switching in the read operation of the boot program-data in the second embodiment. In the following description, it is assumed that the pages 202-10 and 202-20 of the main block MB (that is, the block 201-1) are failure pages.

After the boot process starts, steps S2 to S18 are repeated, and the 512-byte data 104 (the boot program data) are sequentially read and transferred from the block 201-1 to the CPU 4 in the order from the page 202-0 to the page 202-9. When the error detection circuit 33B determines the page 202-10 of the block 201-1 as a failure page, the readdressing circuit 1B executes operations of step S8 to S11, and switches the destination block to the sub block SB (that is, the block 201-2). Subsequently, the procedure is jumped to step S3, and the 512-byte data 104 are read from the page 202-10 of the sub block SB and transferred to the CPU 4. After the 512-byte data 104 stored in the page 202-10 of the sub block SB are transferred to the RAM 5, the block selecting circuit 21B switches the destination block to the main block MB (that is, the block 201-1).

The procedure is then jumped to step 52 after the 512-byte data 104 are read from the page 202-10 and transferred to the CPU 4. The CPU 4 then specifies the address of the destination page from which the 512-byte data 104 are to be read next. In this embodiment, the CPU 4 specifies the address of the page 202-11. Subsequently, the operations of steps S2 to S18 are repeated, and the 512-byte data 104 are sequentially read from the pages 202-11 to 202-19 of the main block MB (the block 201-1). When the page 202-20 is determined as a failure page, the destination block is switched to the sub block SB (the block 201-2) and the 512-byte data 104 are read from the page 202-20 of the sub block SB. After the 512-byte data 104 are read and transferred to the CPU 4, the destination block is switched to the main block SB (the block 201-1). In the similar way, the 512-byte data 104 are sequentially read from pages 202-21 to 202-31 of the block 201-1.

As described above, the CPU 4 in the microcomputer 100B is operated to read the boot program data stored in the pages 202-0 to 202-31 from the flash memory 200. In the default operation, the CPU 4 reads the boot program data from the main block MB. When a failure page is found in the main block MB, the CPU 4 switches the destination block to the sub block SB. In the example of FIG. 8, in which the pages 202-10 and 202-20 are failure pages, the boot program data are read from the pages 202-0 to 202-9, pages 202-11 to 202-19, and pages 202-21 to 202-31 of the main block MB (the block 201-1) and the pages 202-10 and 202-20 of the sub block SB (the block 201-2).

In the semiconductor device in the second embodiment, two blocks: the main block MB and the sub block SB are used to store the same boot programs. When a failure page is found in the main block MB, the boot program data are read from the corresponding page of the sub block SB to avoid data error. Therefore, the semiconductor device in the second embodiment successfully reads the boot program as far as at least one of corresponding pages of the main block MB and the sub block SB is not a failure page. This allows stably performing the boot process which involves reading the boot program from an WAND type flash memory.

Additionally, the microcomputer 100B in this embodiment switches the destination block from the main block MB to the sub block SB, every when a failure page is found in the main block MB, and the destination block is switched again from the sub block SB to the main block MB, after the boot program data are read from the corresponding page of the sub block SB. Such architecture of microcomputer 100B in this embodiment effectively reduces the number of blocks prepared for storing the boot programs and allows effectively utilizing the memory resource. It should be noted that, although the conventional technique also sequentially switches the destination block, every when a failure page is found, the boot process is undesirably terminated when all of the blocks are each determined as including a failure page.

In this embodiment, the block selector 20B is configured to increment the block number 103 contained in the block counter 12B, and to determine the destination block from which the boot program data are to be read. It should be noted that the number of selectable blocks 201 is two in this embodiment. Therefore, the block selector 20B may be alternatively configured so as to include a selector for selecting the destination block.

Although the read operation of the boot program from the NAND type flash memory is explained above, the architecture of the second embodiment is applicable to semiconductor devices which are configured to sequentially read data and programs from a memory device.

Third Embodiment

In a third embodiment, a semiconductor device is configured to include an NAND type flash memory having a plurality of blocks storing the same boot programs, and to execute, in response to an error detection of read data in a certain page of a certain block, rereading of the data from a corresponding page of another block. As is the case of the second embodiment, the semiconductor device in the third embodiment defines one block as a main block MB, which is mainly specified as the destination block, and defines a plurality of blocks as sub blocks SB specified as the destination block only when a failure page is found in the main block MB. The semiconductor device in the third embodiment avoids data error in reading the boot program by switching the destination block among the main block MB and the sub blocks SB.

The semiconductor device in the third embodiment additionally includes a failure counter used to count the number of failure pages in the respective blocks, and a main block selector which redefines one of the sub blocks SB as the main block MB. It should be noted that a plurality of blocks are defines as the sub blocks SB in this embodiment. When a failure page is found in a certain sub block SB, another sub block SB is selected as the destination block, to thereby continue the boot process. Details of the semiconductor device in the third embodiment are described below with reference to FIGS. 9 to 12.

(Device Configuration)

Figure 9:
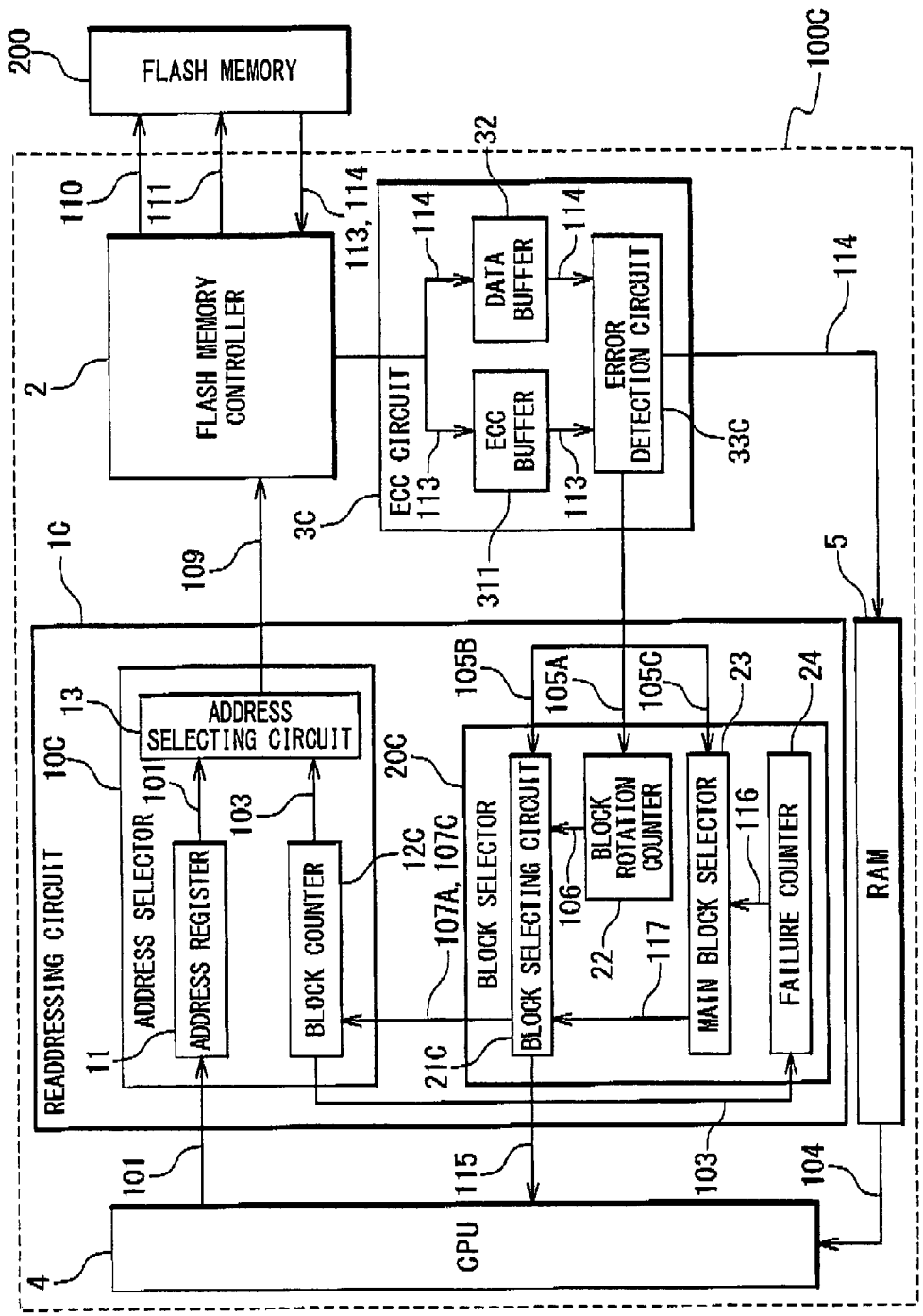
FIG. 9 is a block diagram illustrating the configuration of the semiconductor in a third embodiment of the present invention.

FIG. 9 is a block diagram illustrating the structure of the semiconductor device in the third embodiment. The semiconductor device in the third embodiment includes a microcomputer 100C and a flash memory 200 for storing the boot program used for booting the microcomputer 100C. It is preferable that circuits within the microcomputer 100C are integrated within a single semiconductor chip. The microcomputer 100C and the flash memory 200 may be monolithically integrated in a single semiconductor chip. The microcomputer 100C in the third embodiment includes a readdressing circuit IC and an ECC circuit 3C instead of the readdressing circuit 1B and the ECC circuit 3B in the second embodiment. Components of the microcomputer 100C denoted by the same reference numerals as those in the microcomputer 100B of the second embodiment operate in the similar way, and therefore detailed explanations of such components are not given in the following. In the third embodiment, the same boot programs are duplicatedly stored in the blocks 201-1 to 201-3 in the flash memory 200. The block 201-1 is initially defined as the main block MB, while the blocks 201-2 and 201-3 are initially defined as the sub blocks SB.

The readdressing circuit 1C in the second embodiment includes an address selector 10C and a block selector 20C. The address selector 10C specifies the destination block and page on the basis of the result of the error detection in the ECC circuit 3C. The block selector 20C selects the destination block. In the default operation, the readdressing circuit IC specifies the main block MB as the destination block. When a failure page is found in the main block MB, the readdressing circuit 1C specifies one of the sub blocks SB as the destination block. After the program data are read from the corresponding page of the specified sub block SB, the main block MB is specified again as the destination block.

The address selector 10C includes an address register 11, a block counter 12C, and an address selecting circuit 13. The block counter 12C updates the block number 103 in response to block specification signals 107A and 107C received from the block selector 20C. In one embodiment, the block counter 12C increments the block number containing therein in response to the assertion of the block specification signal 107A, and is set to the block number of the main block MB in response to the assertion of the block specification signal 107C. The address selecting circuit 13 issues an address specifying signal 109 to the flash memory controller 2, in response to the address 101 contained in the address register 11 and the block number 103 contained in the block counter 12C. The flash memory controller 2 accesses the destination page of the destination block of the flash memory 200, as specified by the address specifying signal 109.

The block selector 20C includes a block selecting circuit 21C, a block rotation counter 22, a main block selector 23 and a failure counter 24. The block rotation counter 22 counts the number of times of block switching 106 in response to the failure notification signal 105A. The failure counter 24 counts the number of failure pages included within each block 201 in response to a failure notification signal 105C received from the ECC circuit 3C; the number of failure pages included within each block 201 is referred to as the number of failures 116, hereinafter. In detail, a failure counter 24 includes a set of counters associated with the blocks 201-1 to 201-3, respectively, and when a failure page is found in relevant one of the blocks 201-1 to 201-3, increments the counter value of the counter associated with the relevant block. It should be noted that, when the block number 103 is updated in the block counter 12C, the failure counter 24 obtains the updated block number 103 and activates the counter associated with the updated block number 103. The failure counter 24 is responsive to the failure notification signal 105C to increments the counter value of the activated counter. Such operation allows the failure counter 24 to count the number of failure pages (or the number of failures 116) of the block specified as the destination block. The main block selector 23 refers to the numbers of failures 116 contained in the failure counter 24, and selects the main block MB out of the blocks 201-1 to 201-3. In details, the main block selector 23 contains the allowed maximum number of failures EM, which is the upper limit of the number of failures 116. The main block selector 23 includes a register containing the block number of the main block MB (which is referred to as the main block number 117), and updates the main block number 117 when the number of failures 116 of the main block MB is increased up to the allowed maximum number of failures EM.

The block selecting circuit 21C specifies the destination block in accordance with the number of times of block switching 106, the number of failures 116, and the main block number 117. When a failure page is detected by the ECC circuit 3C, the block selecting circuit 21C asserts the block specification signal 107A, which fed to the block counter 12C. The block counter 12C increments the block number 103 in response to the assertion of the block specification signal 107A. In addition, when all the corresponding pages of the blocks 201-1 to 201-3 specified by the same address are determined as failure pages, the block selecting circuit 21C instructs the CPU 4 to terminate the boot process by asserting the error signal 115. In detail, the block selecting circuit 21C retains the allowed maximum number of block switching TM, and asserts the error signal 115 when the number of times of block switching 106 is increased up to the allowed maximum number of times of block switching TM. In this embodiment, the allowed maximum number of times of block switching TM is three, since three blocks 201-1 to 201-3 (that is, one main block MB and two sub blocks SB) are used for storing the same boot programs.

When the 512-byte data 104 for one page are completely prepared in the RAM 5, the block selecting circuit 21C specifies the main block MB as the destination block from which the boot program data are to be read next. In detail, the ECC circuit 3C asserts the data output notification signal 105B, which is fed to the block selecting circuit 21C, after transferring a complete set of the 128-byte data 114-1 to 114-4 for one page to the RAM 5. In response to the data output notification signal 105B, the block selecting circuit 21C issues the block specification signal 107C indicative of the main block number 117 to the block counter 12C to thereby specify the main block MB as the destination block from which the boot program data are to be read next. The block number 103 contained in the block counter 12C is set to the main block number 117 in response to the block specification signal 107C.

The ECC circuit 3C includes an ECC buffer 31, a data buffer 32, and an error detection circuit 33C. The error detection circuit 33C receives the 128-byte data 114 from the data buffer 32, and performs error detection on the received 128-byte data 114 by using the ECC data 210 corresponding to the received 128-byte data 114. In addition, the error detection circuit 33C includes a correction circuit (not shown), and performs error correction when detecting a CE (correctable error) When determining the received 128-byte data 114 include an UCE (uncorrectable error), the error detection circuit 33C asserts the failure notification signal 105A, which is fed to the block rotation counter 22, and also asserts the failure notification signal 105C, which is fed to the failure counter 24. When determining the data 114 does not include the UCE, on the other hand, the error detection circuit 33C transfers the 128-byte data 114 in the RAM 5 after the error correction if necessary. When transferring the 128-byte data 114-4 in the RAM 5, the error detection circuit 33C asserts the data output notification signal 105B, which is fed to the block selecting circuit 21C.

As described above, the readdressing circuit 1C in the third embodiment switches the destination page from the page specified by the address 101 of the main block MB to the corresponding page specified by the address 101 of one of the sub blocks SB, when a data error is found in the data read from the page of the main block MB. Specifically, in the default operation, the readdressing circuit 1C specifies the main block MB (the block 201-1) as the destination block. When a failure page is detected in the main block MB, the destination page is switched to the corresponding page of one of the sub blocks SB specified by the same address as the failure page found. When the 512-byte data 104 read from the selected sub block SB are transferred to the CPU 4, the main block ME is specified again as the destination block from which the program data are to be read next, and the boot program data are then read from the page next to the failure page of the main block MB. When many failure pages are found in the main block MB. The readdress circuit 1C redefines one of the sub block SB as the main block MB. Additionally, when a failure page is found in a sub block SB, another sub block SB is specified as the destination block to continue the boot process.

(Operation)

Figure 10:
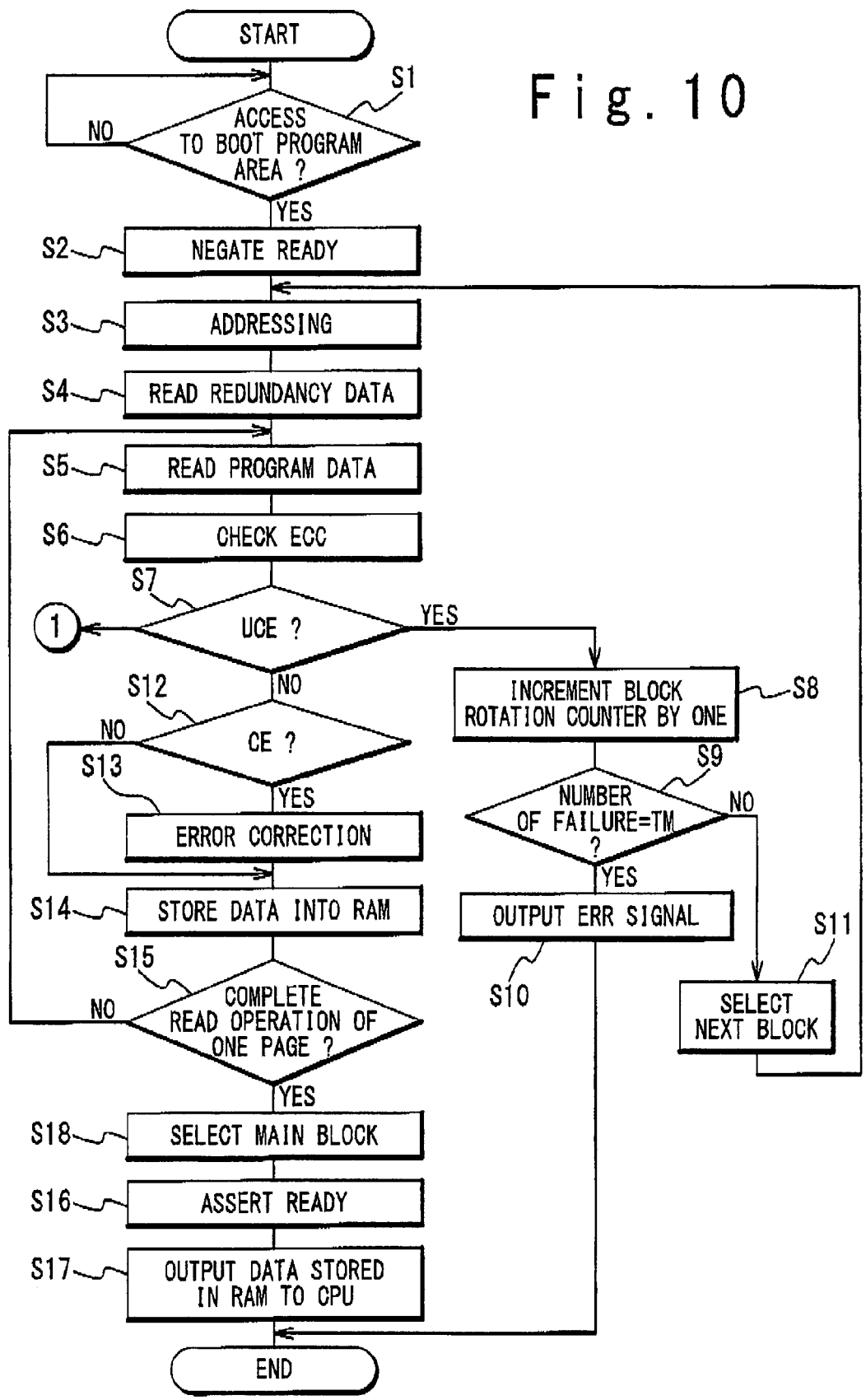
FIG. 10 is a flowchart illustrating the booting process of the semiconductor device in the third embodiment.
Figure 11:
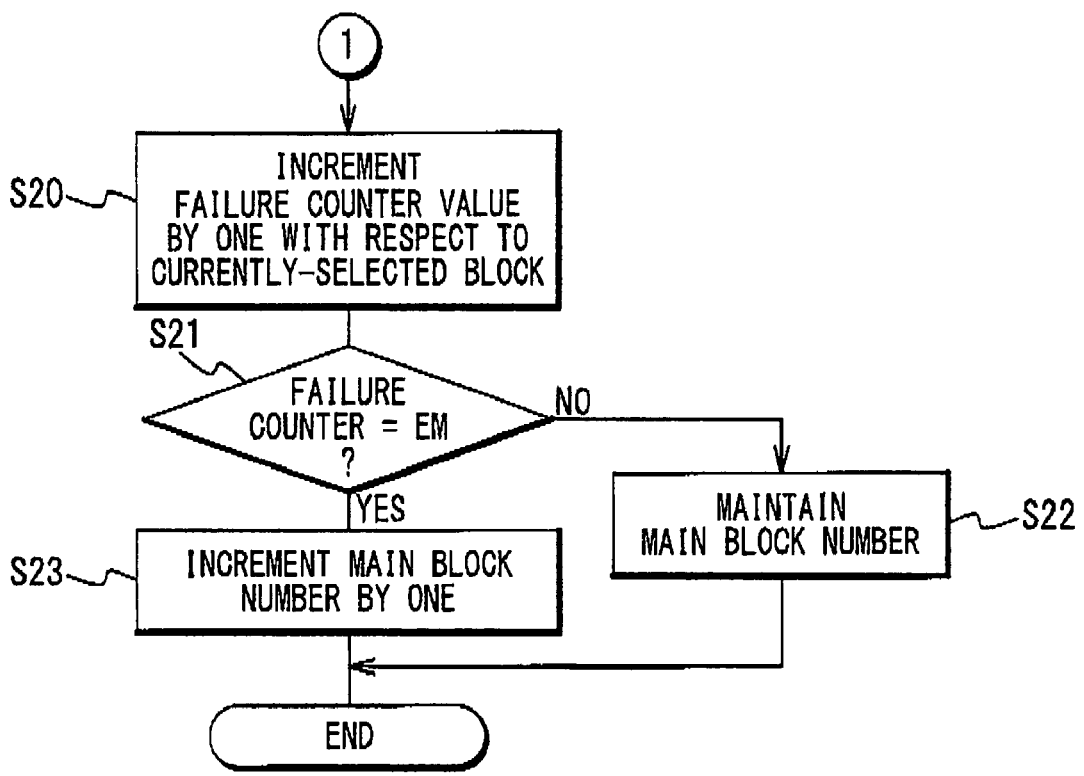
FIG. 11 is a flowchart illustrating the process of specifying the main block in the third embodiment.

Referring to FIGS. 10 to 12, details of the boot process in the third embodiment will be explained below. FIG. 10 is a flowchart illustrating the procedure of reading the boot program in the third embodiment, while FIG. 11 is a flowchart illustrating the procedure of specifying the main block MB in the third embodiment. FIG. 12 is a schematic diagram illustrating the destination block switching in the read operation of the boot program in the third embodiment. It should be noted that the same boot programs are stored in the blocks 201-1 to 201-3, and the block 201-1 is initially defined as the main block MB, while the blocks 201-2 and 201-3 are initially defined as the sub blocks SB-1 and SB-2. In FIGS. 10 and 11, the same operations are performed in the steps denoted by the same reference numerals as those in the first and second embodiments, and detailed explanations thereof are not given in the following.

Referring to FIG. 10, the CPU 4 starts to access the flash memory 200 via the internal bus, in response to a reset signal being asserted in the system booting (including the power-on of the system and the rebooting of the system). Subsequently, step Si to step S15 are repeated in the same way as the first embodiment, and the 128-byte data 114-1 to 114-4 are sequentially read from the pages 202 of the block 201-1 specified by the address 101 contained in the address register 11, and transferred to the RAM 5. When the complete set of the 128-byte data 114-1 to 114-4 are completely prepared in the RAM 5 and then transferred to the CPU 4, the block selecting circuit 21C specifies the block 201-1 (the main block MB) as the destination block from which the program data are to be read next (step S18). In detail, the error detection circuit 33C asserts the data output notification signal 105B, which is fed to the block selecting circuit 21C, when the data 114-4 are finally transferred to the RAM 5. In response to the data output notification signal 105B, the block selecting circuit 21C issues the block specification signal 107C to the block counter 12C. In response to the block specification signal 107C, the block counter 12C is set to the block number of the main block MB (in this embodiment, the block number 103 of the block 201-1, that is, one). As a result, the readdressing circuit 1C specifies the main block MB (the block 201-1) as the destination block, when the program data are then read from the page specified next by the CPU 4.

When the 512-byte data 104 for the specified page are completely transferred from the flash memory 200 to the RAM 5 (step S15: Yes), a bus state signal is asserted (step S16), and the 512-byte data 104 are transferred from the RAM 5 to the CPU 4 (step S17). After the 512-byte data 104 are transferred from the RAM 5 to the CPU 4, the block rotation counter 22 is reset to the initial value.

As described above, the microcomputer 100C is configured to store the address 101 specified by the CPU 4 in the address register 11, to read the boot program data from the page corresponding to the address 101, and to perform error detection on the boot program data in units of 128-byte data each associated with ECC data. When a failure page is detected, the destination block is switched from the main block MB to selected one of the sub blocks SB, and the boot program data are read from the corresponding page 202 of the selected sub block SB again. When a failure page is found in the main block MB, for example, the corresponding page 202 of the sub block SB-1 is specified as the destination page. When the specified page 202 of the sub block SB-1 is defined as a failure page, the corresponding page 202 of the sub block SB-2 is then specified as the destination page. Additionally, when the 512-byte data 104 for one page are completely read from the sub block SB, the destination block is switched to the main block MB.

Furthermore, the microcomputer 100C is configured to redefines one of the sub blocks SB as the main block MB, when the number of failures 116 of the main block MB is increased up to the allowed maximum number of failures EM. Referring to FIG. 11, the operation for specifying the main block MB is described in the following.

When an UCE is found in the 128-byte data 114 at step S7, the failure counter 24 increments the count value of the counter associated with the block 201 currently specified as the destination block (step S20). In detail, the error detection circuit 33C asserts the failure notification signal 105C, which is fed to the failure counter 24, when detecting a failure page. The failure counter 24 then obtains the block number 103 from the block counter 12C in response to the failure notification signal 105C, and increments the count value of the counter corresponding to the block number 103.

The main block selector 23 compares the number of failures 116 of the main block MB with the allowed maximum number of failures EM when the failure counter 24 is updated (step S21) When the number of failures 116 of the main block MB is not increased up to the allowed maximum number of failures EM, the main block selector 23 maintains the current main block number 117 (step S22). When the number of failures 116 of the main block MB is increased up to the allowed maximum number of failures EM, the main block selector 23 increments the main block number 117 to update the main block number 117 (step S23). For example, the main block number 117 is incremented from one to two to specify the block 201-2 as the main block MB instead of the block 201-1. The main block selector 23 retains the main block number 117 determined in step S22 or step S23. Although the main block MB is redefined by incrementing the main number 117 by one in the present embodiment, the way of redefining the main block MB is not limited to this. For example, the sub block SB having the smallest number of failures 116 may be specified as the main block MB. It is preferable that the procedure of specifying the main block MB at steps S20 to S23 are completed before the procedure of switching the destination block at step S11.

When the boot programs are each stored in multiple pages of the blocks 201-1 to 201-3, (for example, all of the pages 202-0 to 202-31 of the blocks 201-1 to 201-3), the CPU 4 specifies another address 101 corresponding to the next page after receiving the 512-byte data 104 from the RAM 5, and provides the newly specified address 101 for the readdressing circuit 1C. The address register 11 stores the newly specified address 101, and the procedure is jumped to step S3. In the same way as described above, the microcomputer 100C sequentially reads the boot program data from the pages 202-0 to 202-31 of any of the blocks 201-1 to 201-3 to execute the boot process.

FIG. 12 is a schematic view illustrating the procedure of the destination block switching in the read operation of the boot program data in the third embodiment. In the following description, it is assumed that the pages 202-2, 202-5 and 202-10 of the block 201-1, and the pages 202-5 and 202-15 of the block 201-2 are failure pages. It is additionally assumed that the allowed maximum number of failures EM contained in the main block selector 23 is set to three.

After the boot process starts, steps S2 to S18 are repeated, and the 512-byte data 104 (the boot program data) are sequentially read and transferred from the main block MB (the block 201-1) to the CPU 4, in the order from the page 202-0 to the page 202-2.

When the error detection circuit 33C determines that the page 202-2 of the block 201-1 is a failure page in reading the 512-byte data 104, the readdressing circuit IC executes the operations of step SB to S11 to switch the destination block to the block 201-2 (the sub block SB-1). In the meantime, the failure counter 24 increments the number of failures 116 of the block 201-1, while the main block 5 selector 23 maintains the main block number 117 at one, since the number of failures 116 of the block 201-1 is not increased up to the allowed maximum number of failures EM (=3). Subsequently, the procedure is jumped to step S3, and the 512-byte data 104 are read from the page 202-2 of the block 201-2 (the sub block SB-1) and transferred to the CPU 4. After the 512-byte data 104 are read and transferred from the page 202-2 of the block 202-2 to the RAM 5, the block selecting circuit 21C specifies the block 201-1 (the main block MB) again as the destination block from which the boot program data are to be read next.

The procedure is jumped to step S2 after the 512-byte data 104 are read from the page 202-2, and the CPU 4 then specifies the address of the next page 202-3 for the readdressing circuit 1C. The operations of steps S2 to S18 are then repeated to read the boot program data from the pages 202-3 and 202-4 of the block 201-1. When the page 202-5 of the block 201-1 is determined as a failure page, the boot program data is read from the page 202-5 of the block 201-2 instead, as described above. In addition, the number of failures 116 of the block 201-1 (the main block MB) is increased up to two, while the main block number 117 is maintained at one. When the page 202-5 of the block 201-2 is then also determined as a failure page, the readdressing circuit 1C performs the operations of steps S8 to S11 to switch the destination block to the block 201-3 (the sub block SB-2). In the meantime, the failure counter 24 sets the number of failures 116 of the block 201-2 to one, while the main block number 117 is maintained at one. Subsequently, the procedure is jumped to step S3, and the 512-byte data 104 are read from the page 202-5 of the block 201-3 and transferred to the CPU 4. After the 512-byte data. 104 read from the page 202-5 of the block 201-3 are transferred to the RAM 5, the block selecting circuit 21C switches the destination block to the block 201-1 (the main block MB).

The procedure is jumped to step S2 after the 512-byte data 104 are read from the page 202-5, and the CPU 4 then specifies the address of the next page 202-6 for the readdressing circuit 1C. The operations of steps S2 to S18 are then repeated to read the boot program data from the pages 202-6 to 202-9 of the block 201-1. When the page 202-10 of the block 201-1 is determined as a failure page, the boot program data is read from the page 202-10 of the block 201-2 instead, as described above. In addition, the number of failures 116 of the block 201-1 (the main block MB) is increased up to three, and therefore the main block selector 23 switches the main block number 117 to two to specify the block 201-2 as the main block MB. In the read operation for the pages 202-11 to 202-31, the block 201-2 is used as the main block MB. After the 512-byte data 104 read from the page 202-10 of the block 201-2 are transferred to the RAM 5, the block selecting circuit 21C switches the destination block to the block 201-2, which is specified as the new main block MB.

The procedure is jumped to step S2 after the 512-byte data 104 are read from the page 202-10, and the CPU 4 then specifies the address of the next page 202-11 for the readdressing circuit 1C. The operations of steps S2 to 618 are then repeated to read the boot program data from the pages 202-11 to 202-14 of the block 201-2. When the page 202-15 of the block 201-2 is determined as a failure page, the boot program data is read from the page 202-15 of the block 201-3 instead, as described above. In addition, the number of failures 116 of the block 201-2 (the main block MB) is increased up to two, while the main block number 117 is maintained at two. In the similar way, steps S2 to S18 are then repeated to read the 512-byte data 104 from the pages 202-16 to 202-31 of the block 201-2.

As described above, the CPU 4 in the microcomputer 100C is operated to read the boot program stored in the pages 202-0 to 202-31 from the flash memory 200. In the default operation, the CPU 4 reads the boot program data from the main block MB. When a failure page is found in the main block MB, the CPU 4 switches the destination block to the sub block SB. In the example of FIG. 12, the boot program data are read from the pages 202-0 to 202-1, 202-3 to 202-4, and 202-6 to 202-9 of the block 201-1, the pages 202-2, 202-10 to 202-14, 202-16 to 202-31, and the pages 202-5 and 202-15 of the block 201-3.

In the semiconductor device in the third embodiment, three blocks: one main block MB and two sub block SB are used to store the same boot programs. When a failure page is found in the main block MB, the boot program data are read from the corresponding page of selected one of the sub blocks SB to avoid data error. Additionally, when the corresponding page of the selected sub block SB is determined as a failure page, the semiconductor device in the third embodiment obtains the boot program data from the corresponding page of another of the sub blocks SB. Therefore, the semiconductor device in the third embodiment successfully reads the boot program as far as at least one of corresponding pages of the main block MB and the sub blocks SB is not a failure page, as is the case of the first embodiment. Furthermore, the semiconductor device in the third embodiment is configured to stop using the main block MB when the number of failures 116 is increased, and to redefine one of the sub blocks SB as the main block MB. This effectively improves the reliability of the read operation of the boot program. As thus described, the architecture of the semiconductor device in the third embodiment allows stably performing the boot process which involves reading the boot program from an NAND type flash memory.

Additionally, the microcomputer 100C in this embodiment switches the destination block from the main block MB to one of the sub blocks SB, every when a failure page is found in the main block MB, and the destination block is switched again from the selected sub block SB to the main block MB, after the boot program data are read from the corresponding page of the selected sub block SB. Such architecture of microcomputer 100C in this embodiment effective reduces the number of blocks prepared for storing the boot programs and allows effectively utilizing the memory resource. It should be noted that the conventional technique also sequentially switches the destination block, every when a failure page is found, however, the boot process is undesirably terminated when all of the blocks are each determined as including a failure page.

Additionally, the architecture of the semiconductor device in the third embodiment achieves the stable boot process compared with the second embodiment, since a block with high reliability (that is, with a reduced number of failures) is selected as the main block MB.

It should be noted that the device and method of the third embodiment is applicable to a semiconductor device configured to sequentially read data and programs, although the third embodiment is directed to a semiconductor device which reads a boot program from the NAND type flash memory.

It is apparent that the present invention is not limited to the above embodiments, but may be modified and changed without departing from the scope of the invention.

With respect to the third embodiment, for example, two of the three blocks 201-1 to 201-3 are defined as blocks from which the boot program data are allowed to be read, while the remaining one is defined as a spare block. In this case, the allowed maximum number of block switching TM is set to two. In detail, the block 201-1 is initially defined as the main block MB and the block 201-2 is initially defined as the sub block SB, so that the boot program is read from the block 201-1 or 201-2. The block 201-3 is defined as the spare block and the boot program is initially prohibited to be read from the block 201-3. When the number of failure pages (that is, the number of failures 116) of the block 201-1 is increased up to the allowed maximum number of failures EM, the main block MB is switched from the block 201-1 to the block 201-2, and the block 201-3 is used as the sub block SB, thereafter. After switching of the main block MB, the boot program is read and transferred from two blocks 201-2 and 201-3 to the CPU 4, in the same way as the second embodiment.

It should be also noted that the present invention is applicable to a semiconductor device configured to read data and programs in sequence, although the above-described embodiments are directed to a semiconductor device which reads a boot program from the NAND type flash memory.

What is claimed is:

1. A semiconductor device for providing an access control for a memory that includes a plurality of storage regions storing the same boot programs comprised of a set of program data, comprising:
    a memory controller for reading out said program data from said storage regions; and
    an error detection circuit performing error detection on said read program data,
    wherein said memory controller is configured to, when said error detection circuit detects an error in one of said read program data read out from one of said storage regions, read out said program data from different one of said storage regions for a current read out and each subsequent read out and read out said one of said read program data as specified by a CPU,
    said memory controller reads out said one of said read program data from said different one of said storage regions in response to said error being found in said one of said read program data by said error detection circuit,
    further comprising a readdressing circuit,
    wherein said one of said read program data is specified with an address by said CPU;
    said readdressing circuit specifies said address specified by said CPU as a destination address, and indicates one of said storage regions as a destination storage region;
    said memory controller is configured to read out one of said read program data specified by said destination address; and
    said readdressing circuit is configured to contain said address specified by said CPU, and to, when an error is found in said one of said read program data by said error detection circuit, specify different one of said storage regions as said destination storage region for the current read out and each subsequent read out, and to specify said address contained therein as said destination address,
    said readdressing circuit is configured to contain a region number corresponding to said destination storage region, and is responsive to another address being newly specified by said CPU for specifying another one of said storage regions associated with said region number as a next destination storage region, and for specifying said newly specified address as a next destination address,
    said plurality of storage regions include a first storage region,
    said readdressing circuit contains a region number corresponding to said first storage region as a main storage region number, and is responsive to said other address being newly specified by said CPU for specifying said first storage region corresponding to said main storage region number as said next destination storage region, and for specifying said newly specified address as said next destination address,
    said plurality of storage regions include a second storage region, and
    said readdressing circuit specifies a region number corresponding to said second storage region as a newly-specified main storage region number, when a number of said read program data read out from said first storage region which are determined as including an error is increased up to a threshold.

2. The semiconductor device according to claim 1, wherein said memory is an NAND-type flash memory, and
    each of said plurality of storage regions is a block including a plurality of pages respectively storing said set of program data.

3. The semiconductor device according to claim 2, wherein said error detection circuit performs error detection of said read program data by using ECC data stored in said pages.

4. The semiconductor device according to claim 1, wherein said semiconductor device monolithically integrates said memory.

5. The semiconductor device according to claim 1, wherein said readdressing circuit comprises:
    a counter for incrementing a count value corresponding to said first storage region when said error detection circuit detects an error in one of said read out program data read out from said first storage region; and
    a main block selecting circuit contains the main storage region number and the threshold,
    wherein the main block selecting circuit switches the main storage region number to the region number corresponding to said second storage region from that corresponding to said first storage region when the counted value is increased up to the threshold.

6. A semiconductor device for providing an access control for a memory that includes a plurality of storage regions storing the same boot programs, each of said storage regions having a plurality of unit storage regions respectively storing a set of program data of said boot programs, said semiconductor device comprising:
    a memory controller for reading out said program data from said unit storage regions; and
    an error detection circuit performing error detection on said read program data,
    wherein, said memory controller is configured to, when said error detection circuit detects an error in one of said read program data read out from one of said unit storage regions of one of said storage regions, read out said one of said read program data from corresponding one of said unit storage regions of different one of said storage regions for a current read out and each subsequent read out, said memory controller is configured to read out said one of said read program data as specified by a CPU, and said memory controller reads out said one of said read program data from corresponding one of said unit storage regions of said different one of said storage regions, in response to said error being found in said one of said read program data by said error detection circuit, further comprising a readdressing circuit, wherein said set of unit storage regions are respectively associated with addresses, and ones of said unit storage regions associated with the same address each stores the same one of said program data, said readdressing circuit specifies an address specified by said CPU as a destination address, and indicates one of said storage regions as a destination storage region;

said memory controller is configured to read out one of said read program data from one of said unit storage regions specified by said destination address; and said readdressing circuit is configured to contain said address specified by said CPU, and to, when an error is found in said one of said read program data read out by said error detection circuit, specify different one of said storage regions as said destination storage region for the current read out and each subsequent read out, and to specify said address contained therein as said destination address, wherein said readdressing circuit is configured to contain a region number corresponding to said destination storage region, and is responsive to another address being newly specified by said CPU for specifying another one of said storage regions associated with said region number as a next destination storage region, and for specifying said newly specified address as a next destination address, wherein said plurality of storage regions include a first storage region, wherein said readdressing circuit contains a region number corresponding to said first storage region as a main storage region number, and is responsive to said other address being newly specified by said CPU for specifying said first storage region corresponding to said main storage region number as said next destination storage region, and for specifying said newly specified address as said next destination address, wherein said plurality of storage regions include a second storage region, and wherein said readdressing circuit specifies a region number corresponding to said second storage region as a newly-specified main storage region number, when a number of said read program data read out from said first storage region which are determined as including an error is increased up to a threshold.

7. The semiconductor device according to claim 6, wherein said memory is an NAND-type flash memory, and
each of said plurality of storage regions is a block including a plurality of pages respectively storing said set of program data.

8. The semiconductor device according to claim 7, wherein said error detection circuit performs error detection of said read program data by using ECC data stored in said pages.

9. The semiconductor device according to claim 6, wherein said semiconductor device monolithically integrates said memory.

10. The semiconductor device according to claim 6, wherein said readdressing circuit comprises:
a counter for incrementing a count value corresponding to said first storage region when said error detection circuit detects an error in one of said read out program data read out from said first storage region; and
a main block selecting circuit contains the main storage region number and the threshold,
wherein the main block selecting circuit switches the main storage region number to the region number corresponding to said second storage region from that corresponding to said first storage region when the counted value is increased up to the threshold.

11. A boot method for accessing a memory including a plurality of storage regions respectively storing the same boot programs composed of a set of program data, said method comprising:
(A) reading out said program data from said plurality of storage regions; and
(B) performing error detection on said read program data,
(C) reading, when one of said read program data read out from one of said storage regions is determined as including an error in said error detection, said one of said read program data from different one of said storage regions for a current reading out and each subsequent reading out,
wherein said (A) reading out includes:
(D) reading out one of said read program data specified by a CPU; and
said (C) rereading includes:
(E) reading out said specified one of said read program data from said different one of said storage regions in response to said error being found in said one of said read program data by said error detection circuit
wherein an address of said one of said read program data is specified by said CPU;
said (D) reading out includes:
specifying said address specified by said CPU as a destination address,
specifying a destination storage region; and
reading out one of said read program data corresponding to said destination address from said destination storage region; and
said (E) reading includes:
containing said address specified by said CPU;
specifying, when an error is found in said one of said read program data by said error detection circuit, different one of said storage regions as said destination storage region for a current reading and each subsequent reading, and
specifying said address contained therein as said destination address,
wherein said (D) reading out further includes:
containing a region number corresponding to said destination storage region, and
in response to another address being newly specified by said CPU, specifying another one of said storage regions associated with said region number as a next destination storage region and specifying said newly specified address as a next destination address,
wherein said plurality of storage regions include first and second storage regions, and
said booting method further comprising: containing a region number corresponding to said first storage region as a main storage region number; and
in response to said other address being newly specified by said CPU, specifying said first storage region corresponding to said main storage region number as said next destination storage region, and specifying said newly specified address as said next destination address, specifying a region number corresponding to said second storage region as a newly-specified main storage region number, when a number of said read program data read out from said first storage region which are determined as including an error is increased up to a threshold.

12. The boot method according to claim 11, wherein said specifying the region number corresponding to said second storage region as a newly-specified main storage region number comprises:

storing the main storage region number and the threshold in a main block selecting circuit;

incrementing a count value corresponding to said first storage region when said error detection circuit detects an error in one of said read out program data read out from said first storage region; and switching the main storage region number stored in the main block selecting circuit to the region number corresponding to said second storage region from that corresponding to said first storage region when the counted value is increased up to the threshold.

* * * * *